(12) United States Patent
Kono

(10) Patent No.: US 11,695,023 B2
(45) Date of Patent: Jul. 4, 2023

(54) PHOTOELECTRIC CONVERSION APPARATUS AND IMAGING SYSTEM

(71) Applicant: CANON KABUSHIKI KAISHA, Tokyo (JP)

(72) Inventor: Shoji Kono, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/500,481

(22) Filed: Oct. 13, 2021

(65) Prior Publication Data

US 2022/0123034 A1 Apr. 21, 2022

(30) Foreign Application Priority Data

Oct. 20, 2020 (JP) ................................ 2020-176076

(51) Int. Cl.
*H01L 27/146* (2006.01)
*H04N 23/67* (2023.01)
*H04N 25/59* (2023.01)

(52) U.S. Cl.
CPC .. *H01L 27/14607* (2013.01); *H01L 27/14605* (2013.01); *H01L 27/14612* (2013.01); *H01L 27/14627* (2013.01); *H01L 27/14645* (2013.01); *H04N 23/672* (2023.01); *H04N 25/59* (2023.01)

(58) Field of Classification Search
CPC ......... H01L 27/14607; H01L 27/14605; H01L 27/14612; H01L 27/14627; H01L 27/14645; H01L 27/1464; H01L 27/14641; H01L 27/14621; H01L 27/14654; H04N 5/232122; H04N 5/3559; H04N 5/36961; H04N 23/672; H04N 25/59; H04N 25/704
See application file for complete search history.

(56) References Cited

U.S. PATENT DOCUMENTS

| | | | |
|---|---|---|---|
| 10,666,881 B2* | 5/2020 | Kaneko | H04N 5/35563 |
| 2013/0083225 A1* | 4/2013 | Minowa | H01L 27/14812 |
| | | | 257/E31.083 |
| 2017/0373105 A1* | 12/2017 | Galor Gluskin | H04N 5/23212 |
| 2018/0269245 A1 | 9/2018 | Mlinar | |
| 2018/0294306 A1* | 10/2018 | Sambonsugi | H04N 5/341 |
| 2021/0313359 A1* | 10/2021 | Ishikawa | G02B 5/286 |

* cited by examiner

*Primary Examiner* — Shahbaz Nazrul
(74) *Attorney, Agent, or Firm* — Canon U.S.A., Inc. IP Division

(57) ABSTRACT

An apparatus includes a plurality of pixels and a plurality of microlenses. Each of the pixels has a first conversion unit and a second conversion unit surrounding the first conversion unit. The first conversion unit and the second conversion unit each have a light portion to receive light from a corresponding microlens. The first conversion unit and the second conversion unit are under the corresponding microlens. The pixels includes two or more pixels varying in an area ratio between an area of the light *portion of the first conversion unit and an area of the light portion of the second conversion unit.

26 Claims, 26 Drawing Sheets

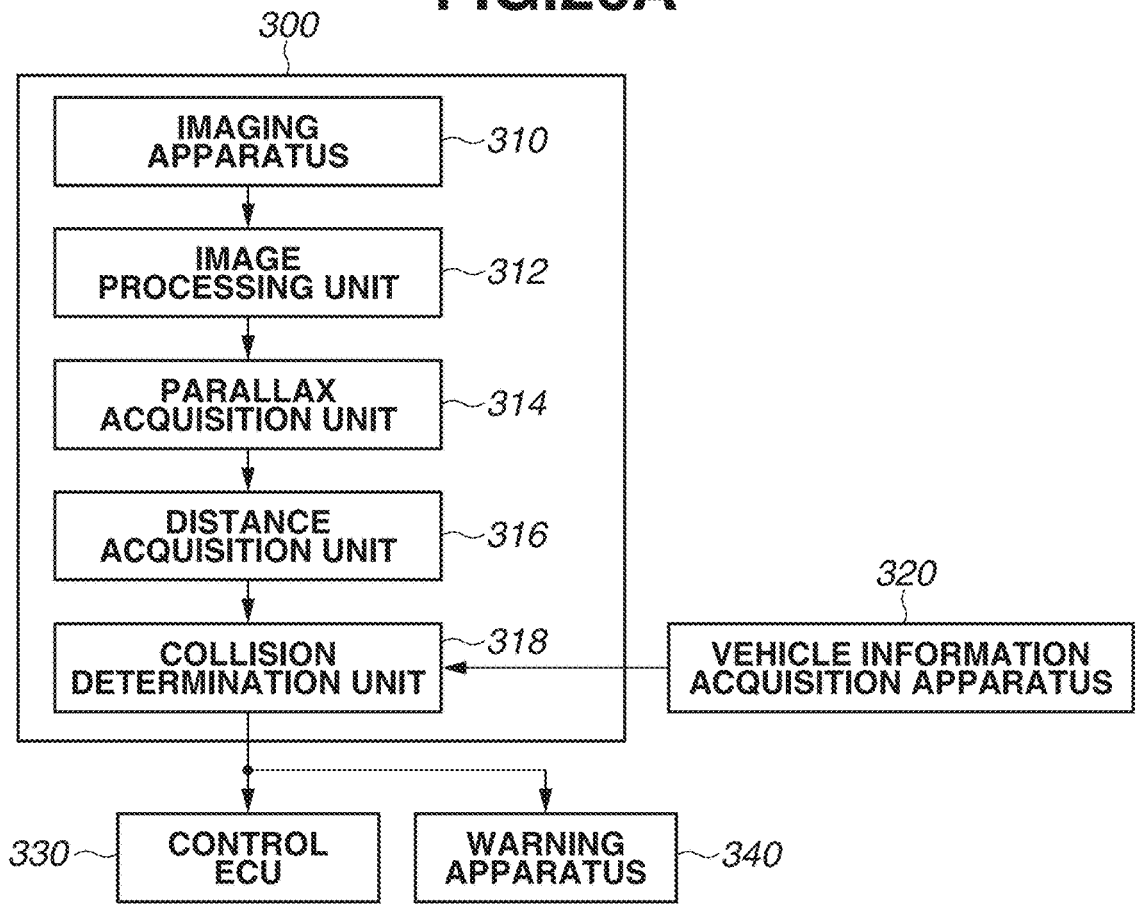
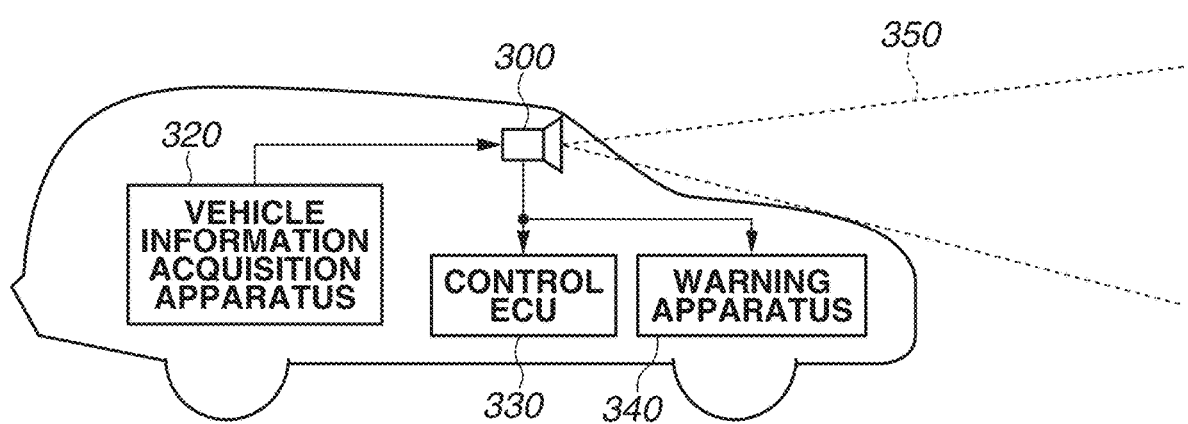

US 11,695,023 B2

PHOTOELECTRIC CONVERSION APPARATUS AND IMAGING SYSTEM

BACKGROUND OF THE DISCLOSURE

Field of the Disclosure

The aspect of the embodiments relates to photoelectric conversion apparatuses, imaging systems including photoelectric conversion apparatuses, moving objects, and semiconductor substrates.

Description of the Related Art

United States Patent Application Publication No. 2018/0269245 discusses a method of expanding the dynamic range of a solid-state imaging apparatus by disposing a pixel having a large light receiving area to surround one pixel, and combining the signals of these two, large and small, pixels.

For example, a camera with a solid-state imaging apparatus discussed in United States Patent Application Publication No. 2018/0269245 incorporated therein has one light receiving area ratio between the two pixels, having a different ratio between the quantities of light incident on the respective two pixels from the light receiving area ratio between the two pixels depending on the F-number of the lens. In addition, there is an issue that a large F-number causes light not to be incident on one of the two pixels, leading to an insufficiently expanded dynamic range.

SUMMARY OF THE DISCLOSURE

According to an aspect of the embodiments, an apparatus includes a plurality of pixels and a plurality of microlenses. Each of the pixels has a first *conversion unit and a second conversion unit surrounding the first conversion unit. The first conversion unit and the second conversion unit each have a light portion to receive light from a corresponding microlens. The first conversion unit and the second conversion unit are under the corresponding microlens. The pixels includes two or more pixels varying in an area ratio between an area of the light portion of the first conversion unit and an area of the light portion of the second conversion unit.

According to another aspect of the embodiments, a substrate to be on another substrate includes a plurality of pixels and a plurality of microlenses. Each of the pixels has a first conversion unit and a second conversion unit surrounding the first conversion unit. The first conversion unit and the second conversion unit each have a light portion to receive light from a corresponding microlens. The first conversion unit and the second conversion unit are under the corresponding microlens. The pixels includes a plurality of pixels varying in an area ratio between an area of the light portion of the first conversion unit and an area of the light portion of the second conversion unit.

Further features of the present disclosure will become apparent from the following description of exemplary embodiments with reference to the attached drawings.

BRIEF DESCRIPTION OF THE DRAWINGS

FIGS. 26A and 26B are diagrams illustrating a configuration example of an imaging system and a configuration example of a moving object, respectively, according to a seventh exemplary embodiment.

DESCRIPTION OF THE EMBODIMENTS

A photoelectric conversion apparatus and a method of driving a photoelectric conversion apparatus according to a first exemplary embodiment of the disclosure will be described with reference to FIGS. 1 to 15.

Figure 1:
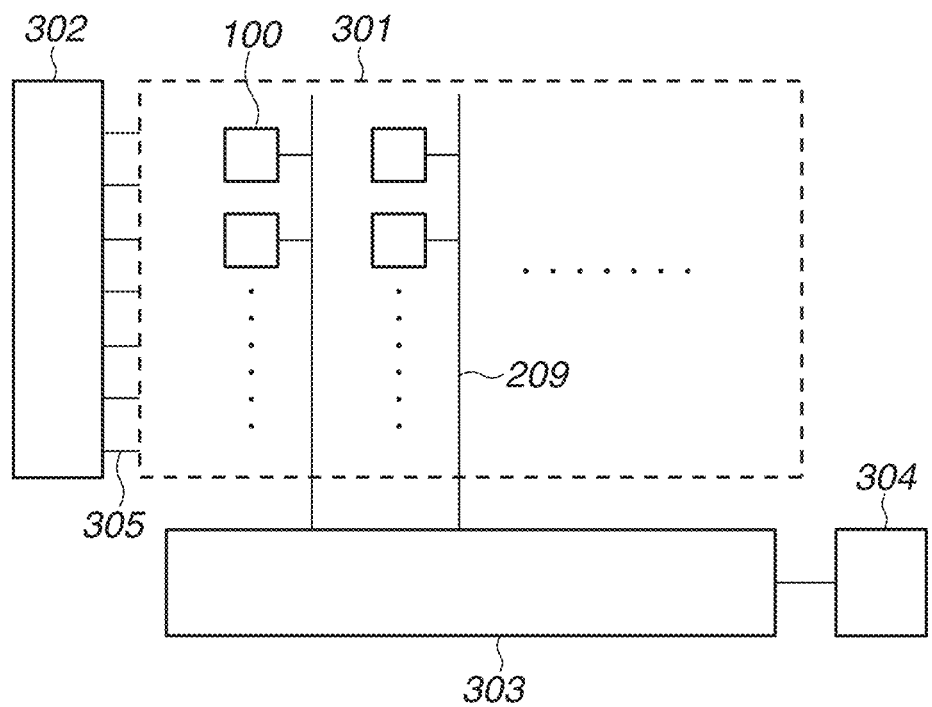
FIG. 1 is a schematic diagram of a photoelectric conversion apparatus according to a first exemplary embodiment.
Figure 2:
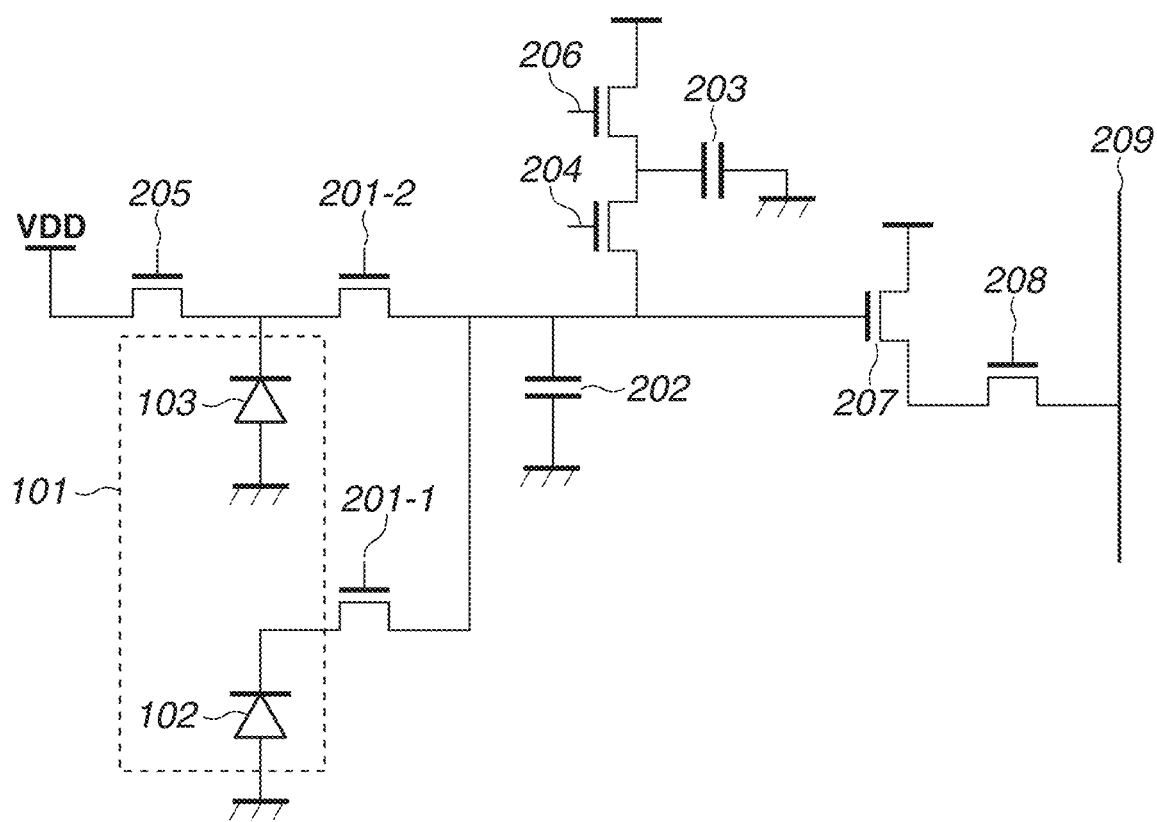
FIG. 2 is a configuration example of a pixel circuit of the photoelectric conversion apparatus according to the first exemplary embodiment.
Figure 3:
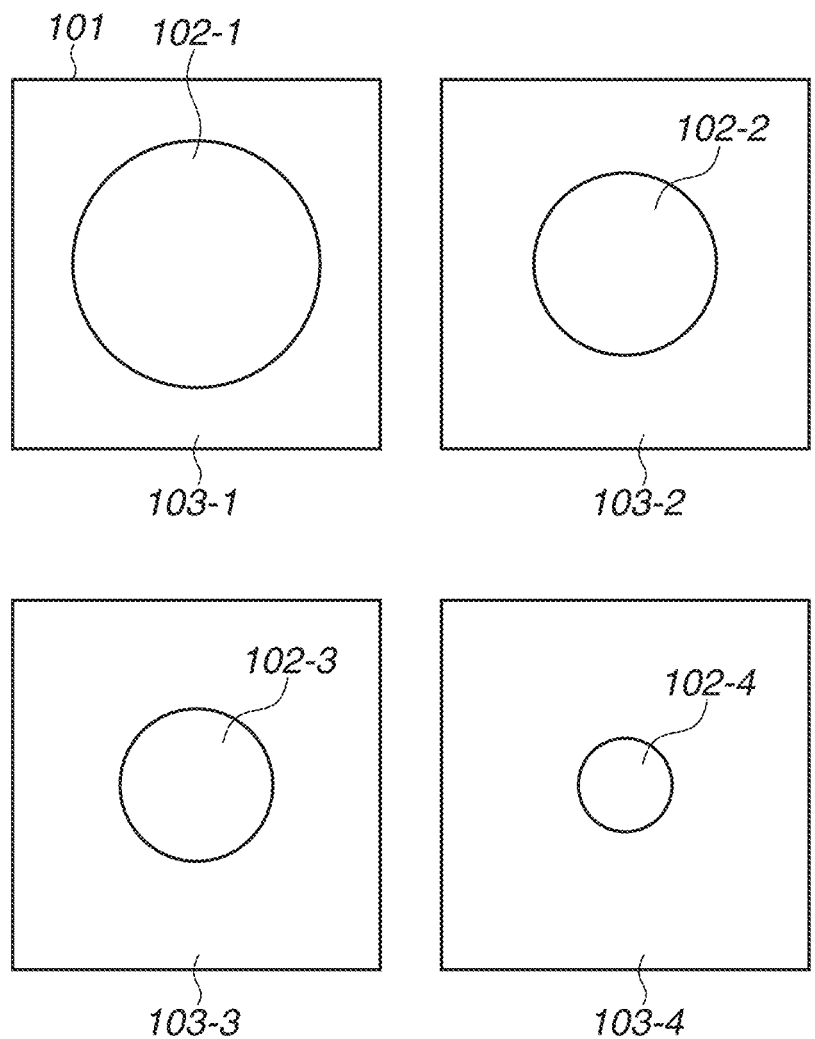
FIG. 3 is a diagram schematically illustrating a planar structure of the photoelectric conversion apparatus according to the first exemplary embodiment.
Figure 4:
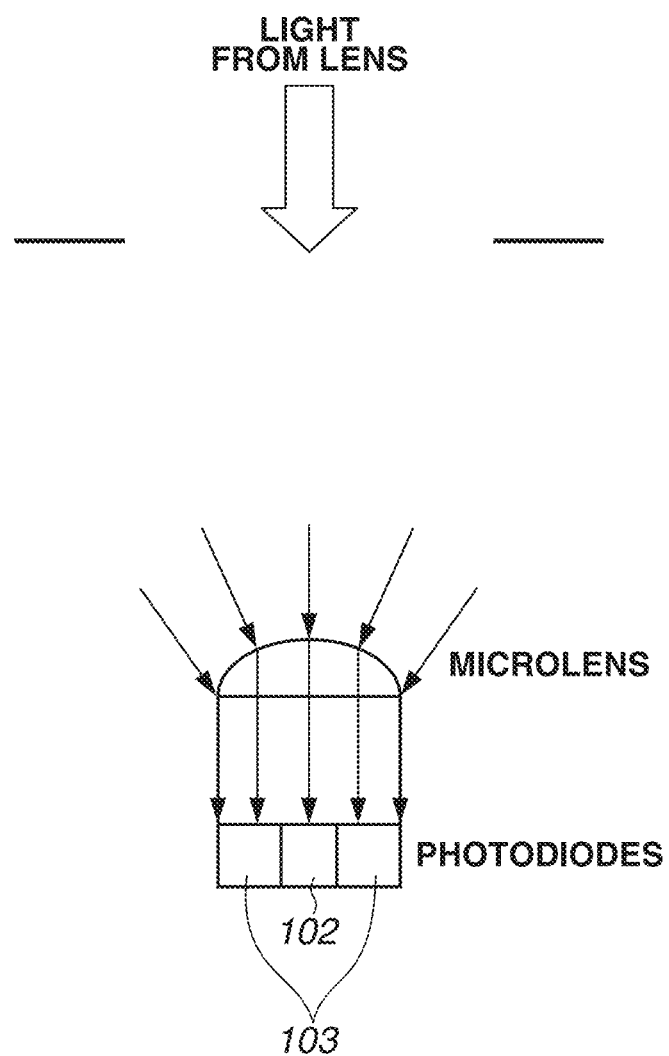
FIG. 4 is a diagram schematically illustrating a diaphragm of a lens and light collection by a microlens according to the first exemplary embodiment.
Figure 5:
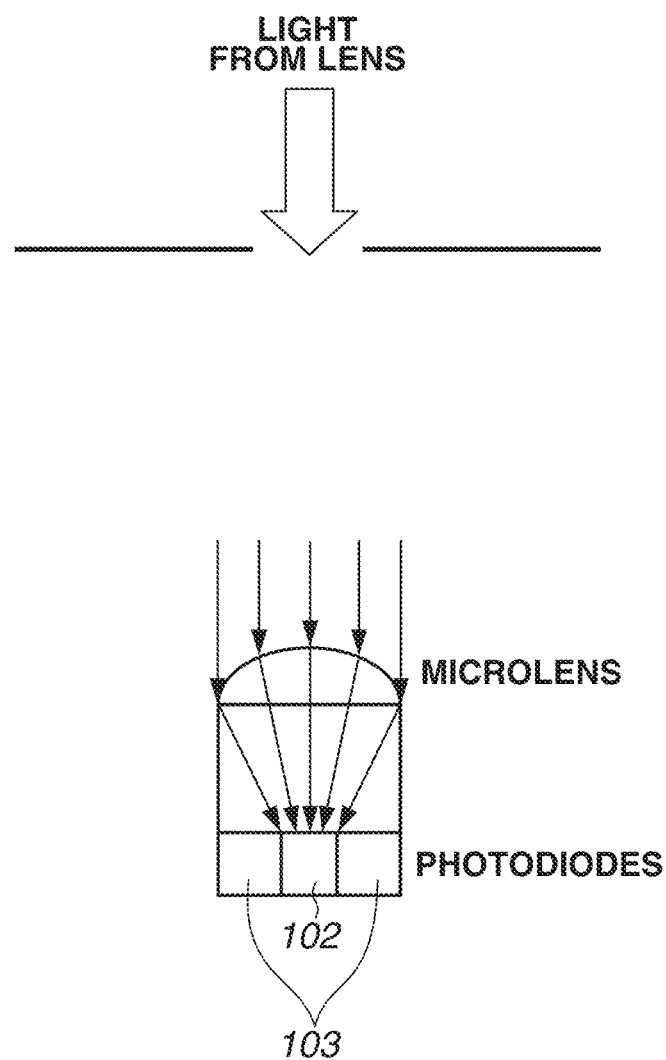
FIG. 5 is a diagram schematically illustrating the diaphragm of the lens and light collection by the microlens according to the first exemplary embodiment.
Figure 10:
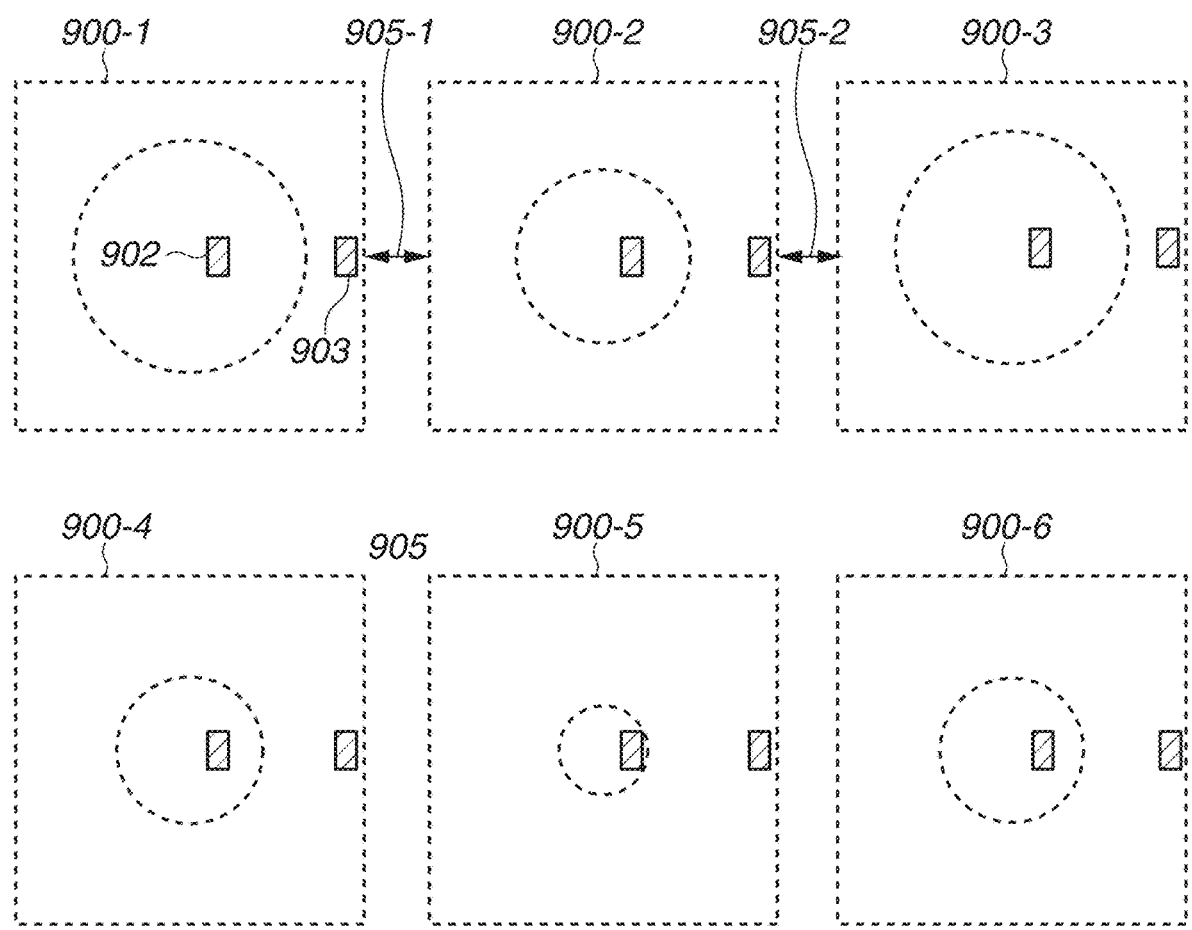
FIG. 10 is a diagram schematically illustrating a planar structure in sight of the back surface of the substrate of the photoelectric conversion apparatus according to the first exemplary embodiment.
Figure 11:
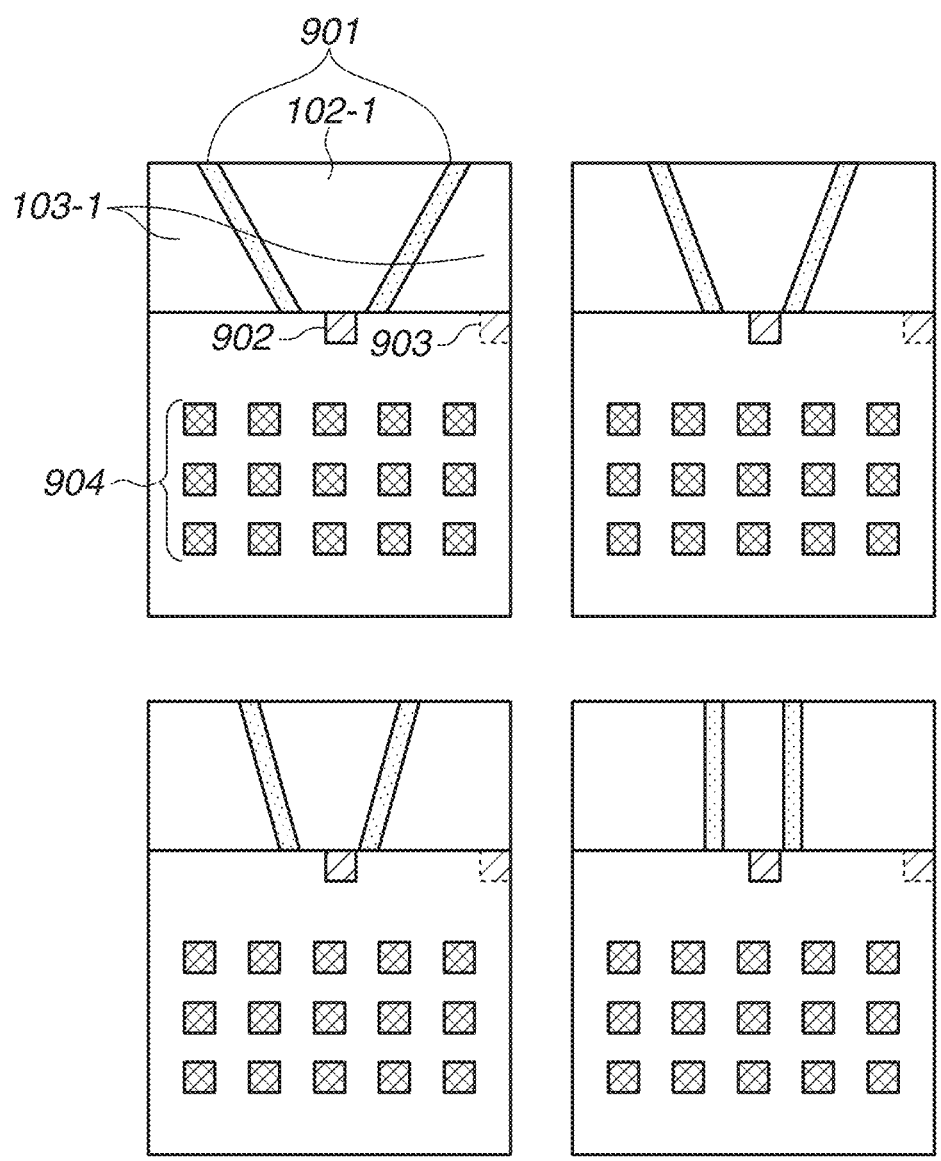
FIG. 11 is a diagram schematically illustrating a sectional structure of the photoelectric conversion apparatus according to the first exemplary embodiment.
Figure 12:
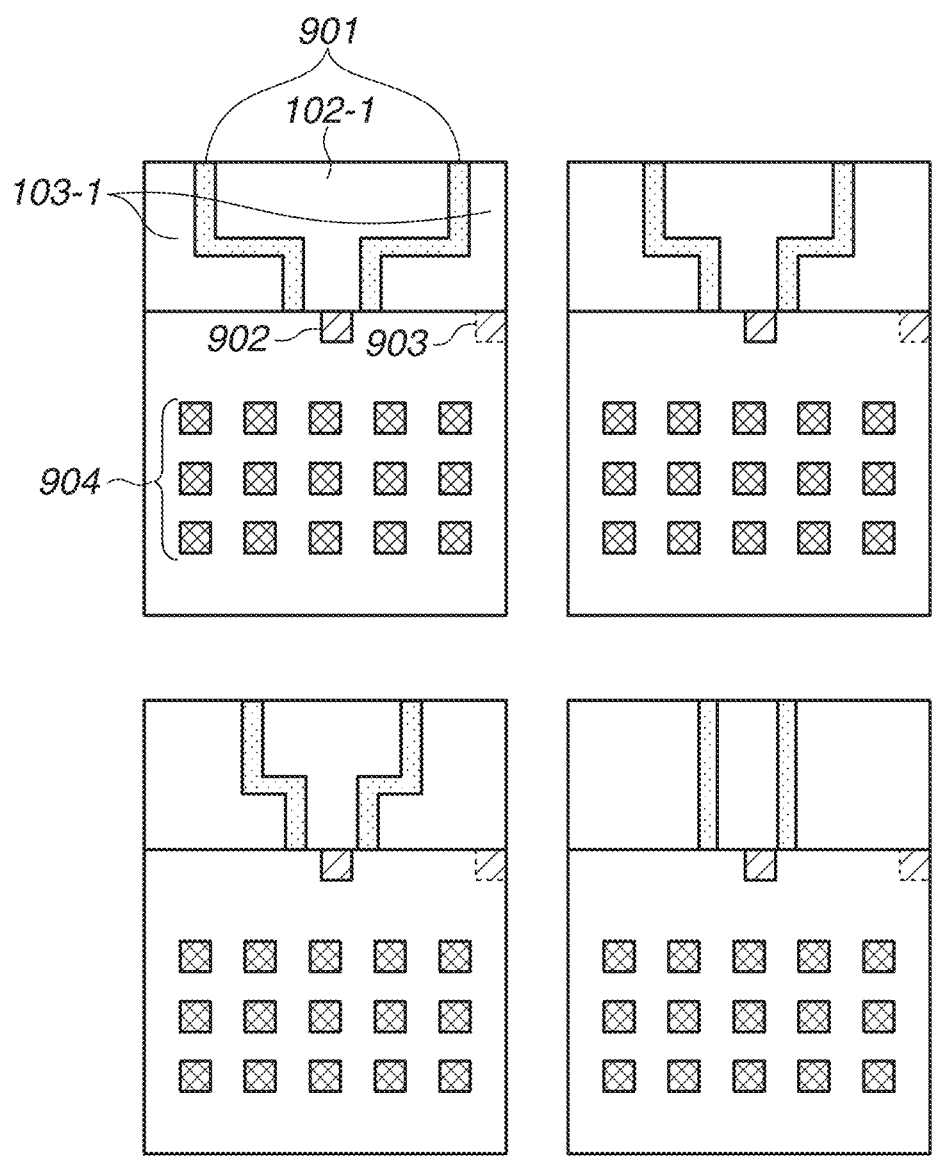
FIG. 12 is a diagram schematically illustrating a sectional structure of the photoelectric conversion apparatus according to the first exemplary embodiment.
Figure 13:
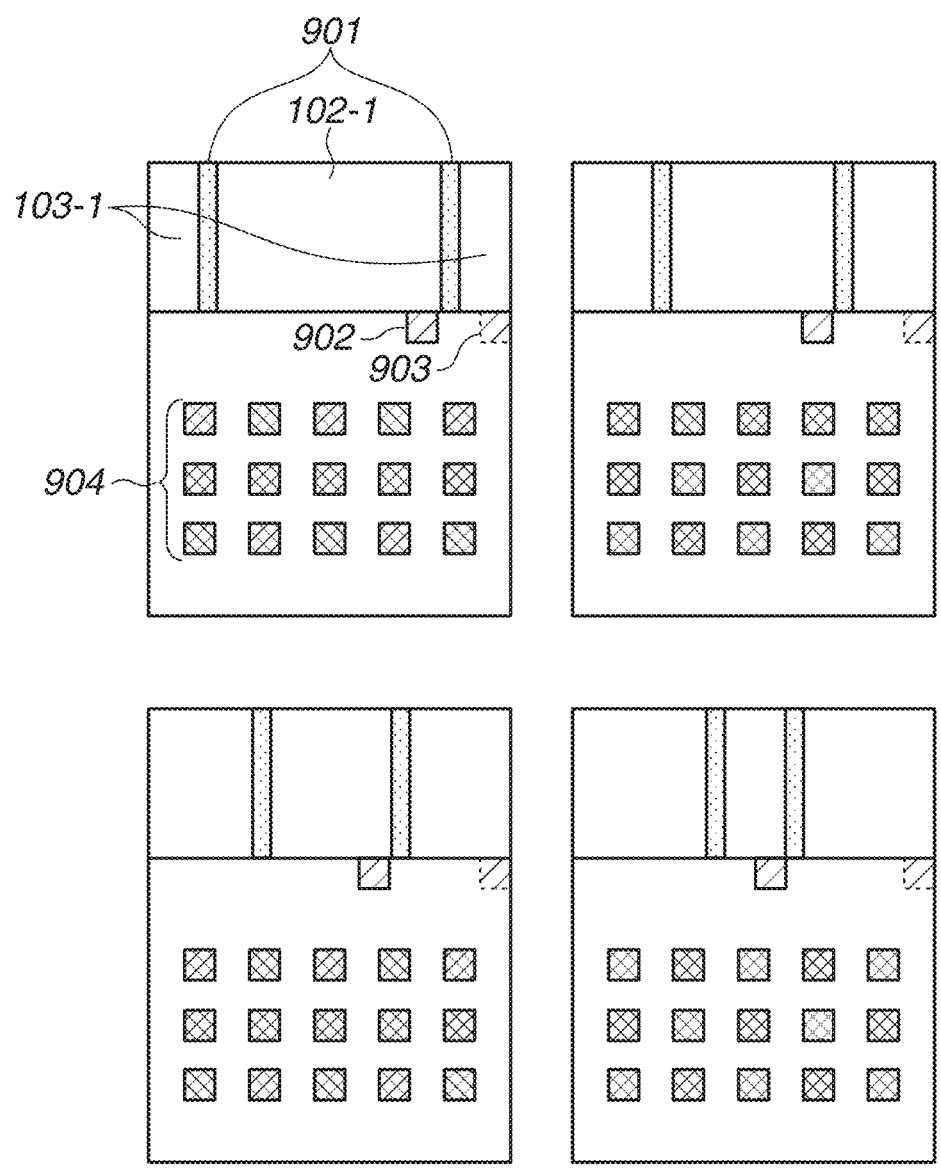
FIG. 13 is a diagram schematically illustrating a sectional structure of the photoelectric conversion apparatus according to the first exemplary embodiment.
Figure 14:
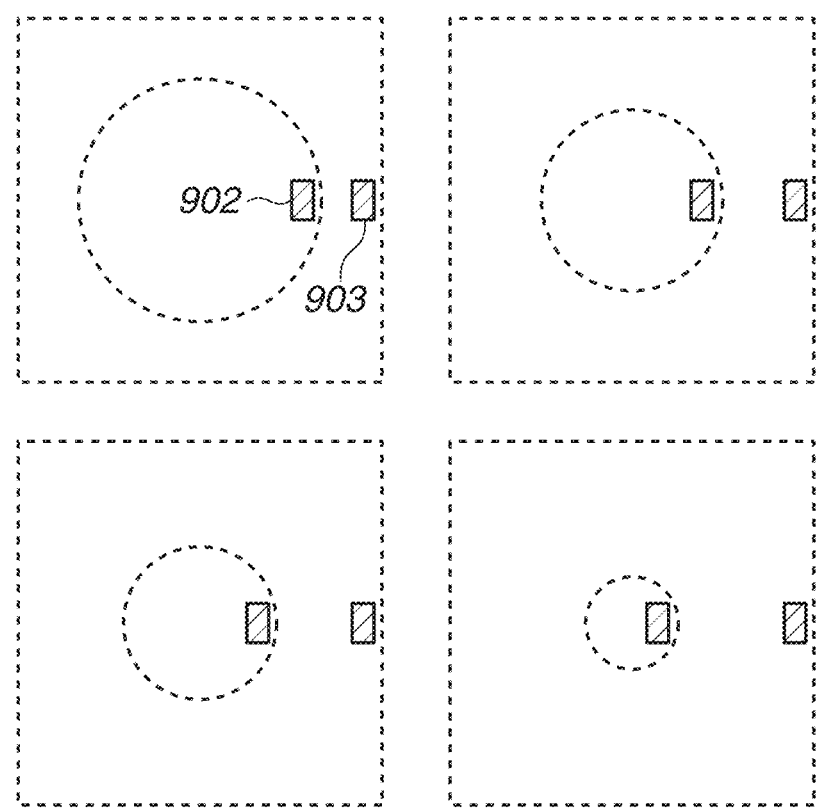
FIG. 14 is a diagram schematically illustrating a planar structure in sight of the back surface of the substrate of the photoelectric conversion apparatus according to the first exemplary embodiment.
Figure 15:
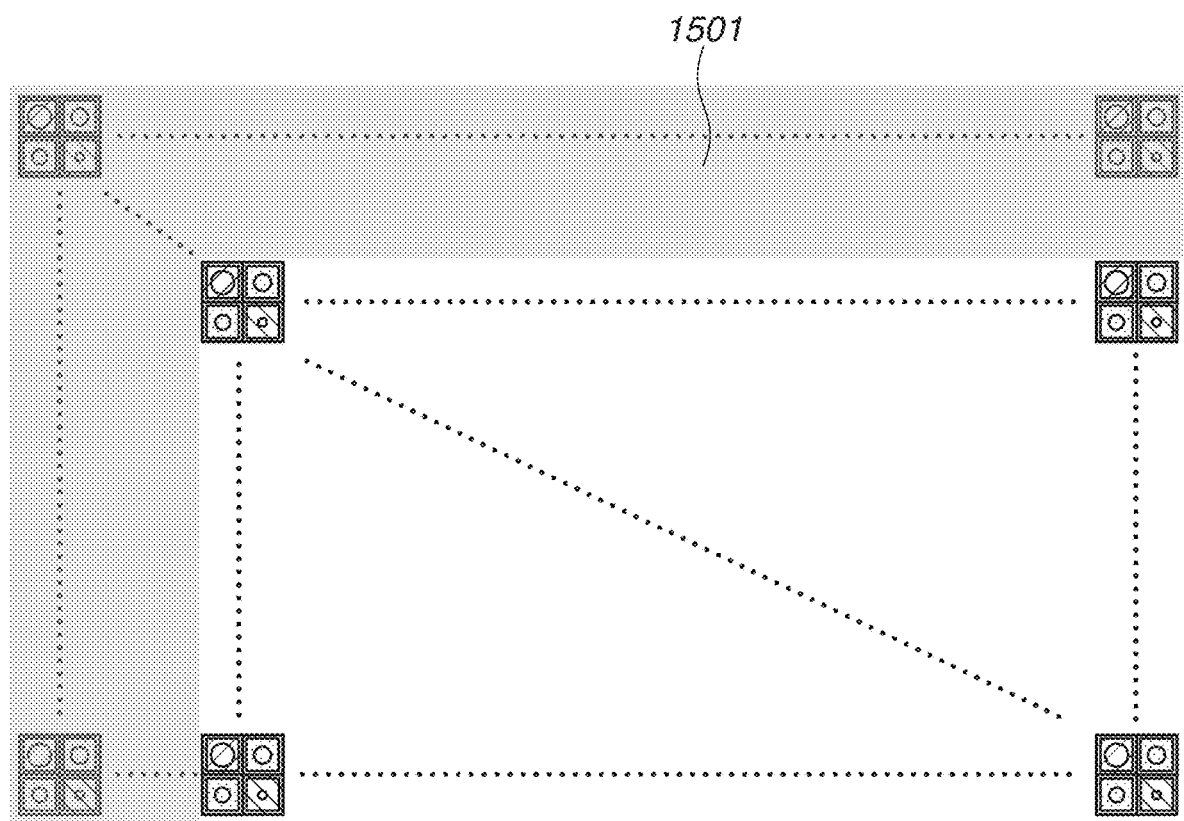
FIG. 15 is a diagram schematically illustrating an arrangement of pixels of the photoelectric conversion apparatus according to the first exemplary embodiment.

FIG. 1 is a schematic diagram of the photoelectric conversion apparatus according to the first exemplary embodiment. FIG. 2 illustrates a configuration example of a pixel circuit of the photoelectric conversion apparatus according to the first exemplary embodiment. FIG. 3 is a diagram schematically illustrating a planar structure of the photoelectric conversion apparatus according to the first exemplary embodiment. FIG. 4 and FIG. 5 are diagrams each schematically illustrating a diaphragm of a lens and light collection by a microlens according to the first exemplary embodiment. FIG. 6 to FIG. 9 are diagrams each schematically illustrating a planar structure of the photoelectric conversion apparatus according to the first exemplary embodiment. FIG. 10 is a diagram schematically illustrating a planar structure in sight of the back surface of the photoelectric conversion apparatus according to the first exemplary embodiment. FIG. 11 to FIG. 13 are diagrams each schematically illustrating a sectional structure of the photoelectric conversion apparatus according to the first exemplary embodiment. FIG. 14 is a diagram schematically illustrating a planar structure in sight of the back surface of the photoelectric conversion apparatus according to the first exemplary embodiment. FIG. 15 is a diagram schematically illustrating an arrangement of pixels of the photoelectric conversion apparatus according to the first exemplary embodiment.

(Overall Configuration of Photoelectric Conversion Apparatus)

The photoelectric conversion apparatus according to the present exemplary embodiment has a pixel region 301, a timing generator 302, a column signal processing circuit 303, and a signal processing circuit 304, as illustrated in FIG. 1.

A plurality of pixels 100 is arrayed in a matrix of rows and columns in the pixel region 301.

A control signal line 305 to each row in the pixel array of the pixel region 301 extends in the row direction (a lateral direction in FIG. 1). The control signal line 305 is connected to each of the pixels 100 arranged in the row direction, and is common to these pixels 100. Further, a vertical output line 209 to each column of the pixel array extends in the column direction (a vertical direction in FIG. 1). The vertical output line 209 is connected to each of the pixels 100 arranged in the column direction, and is common to these pixels 100. The vertical output line 209 is drawn as one line in FIG. 1, but a plurality of vertical output lines may be connected depending on signals to be output.

The number of the pixels 100 in the pixel region 301 is not limited. For example, the pixel region 301 may be formed of the pixels 100 in a few thousand rows and a few thousand columns as with a typical digital camera, or the pixel region 301 may be formed of a plurality of pixels 100 arranged in one row or one column.

The control signal line 305 to each row is connected to the timing generator 302. A pixel signal read out from the pixel 100 is input to the column signal processing circuit 303 through the vertical output line 209. The column signal processing circuit 303 can include a memory that holds pixel signals read out from the pixel 100. The column signal processing circuit 303 sequentially outputs pixel signals column by column via the signal processing circuit 304.

(Configuration of Pixel)

A configuration and a connection relationship of the pixels 100 in the present exemplary embodiment will be described. FIG. 2 is an equivalent circuit diagram of the pixel circuit of the first exemplary embodiment. The pixels 100 each have a photoelectric conversion unit 101, and the photoelectric conversion unit 101 includes a photodiode (PD) 102 and a PD 103.

The pixel circuit includes the PD 102 and the PD 103. The pixel circuit further includes transfer transistors 201-1 and 201-2. The pixel circuit further includes an overflow switch 205, a floating diffusion (FD) capacitance 202, a gain control switch 204, a capacitance element 203, a reset switch 206, a source follower transistor 207, and a select switch 208.

A function and a connection of each element will be described.

The PD 102 and the PD 103 each are an example of the photoelectric conversion unit. Light incident on the PD 102 and the PD 103 generates electric charge through photoelectric conversion. The PD 102 and the PD 103 each accumulate the generated electric charge as signal charge. The anodes of the PD 102 and the PD 103 are connected to the ground potential. The PD 102 is connected to the transfer transistor 201-1, and the PD 103 is connected to the transfer transistor 201-2 and the overflow switch 205.

The transfer transistor 201-1 and the input node (gate) of the source follower transistor 207 are electrically connected to each other. The transfer transistor 201-2 and the input node of the source follower transistor 207 are electrically connected to each other.

Control signals TX1 and TX2 are input to the gate of the transfer transistor 201-1 and the gate of the transfer transistor 201-2, respectively. If the control signals are at High level, the signal charge of each photodiode is transferred to the input node of the source follower transistor 207.

The overflow switch 205 is connected to a power supply VDD and the PD 102. A control signal OF is input to the gate of the overflow switch 205. A potential barrier corresponding to the gate potential is formed in the overflow switch 205. If the control signal OF is at High level, the signal charge of the PD 102 is transferred to the power supply VDD. If the control signal OF has a potential more than or equal to an intermediate potential LM1 (Low<LM1<High), the potential barrier between the power supply VDD and the PD 102 is lower than the barriers in the other regions, outputting the excessive charge to the power supply VDD. The potential barrier between the power supply VDD and the PD 102 is typically lower than the potential barrier of the transfer transistor 201-2.

The transfer transistors 201-1 and 201-2, the gain control switch 204, and the gate of the source follower transistor 207 are interconnected to form one node. This one node may be referred to as an FD node or an FD portion. In FIG. 2, the capacitance of the FD portion is expressed as the FD capacitance 202. The FD capacitance 202 can include the parasitic capacitance component of wiring of the FD portion and the parasitic capacitance component of the gate of a transistor connected to the FD portion. Further, the FD capacitance 202 can include the PN junction capacitance component of the semiconductor region of the FD portion and the PN junction capacitance component of the source or drain of a transistor connected to the FD portion. In addition to these capacitance components, capacitance elements such as a poly-insulator-poly (PIP) capacitance, a metal-insulator-metal (MIM) capacitance, and a metal oxide semiconductor (MOS) capacitance may be included in the FD capacitance 202. If these capacitance elements are disposed, one end of each of these capacitance elements is connected to the transfer transistors 201-1 and 201-2, the gain control switch 204, and the gate of the source follower transistor 207.

The gain control switch 204 is connected to one terminal of the capacitance element 203 and the reset switch 206. A control signal GC is input to the gate of the gain control switch 204. The capacitance element 203 is separated from the FD capacitance 202 by changing the control signal GC to Low level to turn off the gain control switch 204 with electric charge accumulated in the capacitance element 203. Further, whether to include the capacitance element 203 as a part of the FD capacitance 202 is selected by switching the control signal GC between High level and Low level to turn the gain control switch 204 on and off, changing the gain of the charge-voltage conversion. Furthermore, the control signal CG with a potential more than or equal to an intermediate potential LM1 (Low<LM1<High) causes the potential barrier between the capacitance element 203 and the PD 103 to be at a level lower than that of any other barrier, allowing excessive charge to be transferred to the capacitance element 203. Typically, the potential barrier is at a level lower than that of the FD capacitance 202.

The power supply VDD is connected to the reset switch 206 and the source follower transistor 207. A control signal RES is input to the gate of the reset switch 206. The reset switch 206 is on with the control signal RES at High level. Turning on the reset switch 206 can reset the PD 102, the PD 103, the FD portion, and the capacitance element 203 all or some of them.

The source follower transistor 207 is connected to the vertical output line 209 via the select switch 208. A control signal SEL is input to the gate of the select switch 208. The select switch 208 is on with the control signal SEL at High level, forming a source follower circuit with the source follower transistor 207 and the current source.

The anode of the PD 102 and the anode of the PD 103 are each connected to the ground potential. Further, the other terminals of the FD capacitance 202 and the capacitance element 203 are connected to the ground potential.

The PD 103 includes a region at a low potential for the electrons of signal charge, and a potential barrier for the signal charge is formed around this region. In other words, a region at a high potential is locally present in the cathode of the PD 103. As a result, the generated signal charge is accumulated in the cathode of the PD 103. As the electrons of the signal charge are accumulated, the cathode potential of the PD 103 falls. As a result, the height of the potential barrier formed around the PD 103 decreases.

Photoelectric conversion can generate excessive charge exceeding an amount that can be accumulated in the photodiode. If a large quantity of light is incident on the PD 103 to cause excessive electric charge to be generated, the excessive electric charge overflows from a portion at the lowest potential barrier to the outside.

The transfer transistor 201-2 is between the PD 103 and the FD portion, and the gain control switch 204 is between the FD portion and the capacitance element 203. The gate potential (the control signal TX) of the transfer transistor 201-2 controls the height of the potential barrier in the region right under the gate of the transfer transistor 201-2, namely, in the channel region of the transfer transistor 201-2. Similarly, the gate potential (the control signal GC) controls the height of the potential barrier in the region right under the gate of the gain control switch 204, namely, in the channel region of the gain control switch 204.

The control signal TX2 of the transfer transistor 201-2 is controlled so that the potential barrier between the PD 103 and the FD portion is the lowest of the potential barriers surrounding the periphery of the photodiode. This control transfers excessive charge generated in the PD 103 via the transfer transistor 201-2. If the gain control switch 204 is off, the transferred excessive charge is held in the FD portion. The control signal GC input in the gain control switch 204 turns the gain control switch 204 on or off. With the gain control switch 204 on, the transferred excessive charge is held in the FD portion and the capacitance element 203.

Expansion of a dynamic range by the photodiodes and the circuit illustrated in FIG. 2 will be described.

Light incident on the PD 102 and the PD 103 generates electric charge through photoelectric conversion, and the PD 102 and the PD 103 each accumulate the generated electric charge as the signal charge.

Because the light receiving area of the PD 102 is smaller than that of the PD 103, the quantity of incident light per unit time is less than that of the PD 103. Thus, electric charge can be linearly generated with respect to the quantity of incident light, even if intense light that saturates the PD 103 is incident. On the other hand, the light receiving area of the PD 103 is larger than that of the PD 102, and thus the PD 103 receives more light per unit time than the PD 102. Thus, even weak incident light generates a fixed quantity of electric charge. Further, the PD 103 can hold a great number of electrons while preventing the saturation of the pixel by flowing out excessive charge generated during a charge accumulation period, via the overflow switch 205.

In readout of a signal based on the electric charge generated in the PD 102, the transfer transistor 201-1 is turned on with the gain control switch 204 off, allowing the electric charge accumulated in the PD 102 to be transferred to the FD capacitance 202. The electric charge accumulated in the PD 102 is converted into a voltage signal in the FD capacitance 202. As the select switch 208 is turned on, the voltage signal converted from the electric charge in the FD capacitance 202 is output to the column signal processing circuit 303 via the vertical output line 209.

After the signal based on the electric charge generated in the PD 102 is read out, the gain control switch 204 and the reset switch 206 are turned on, resetting the FD capacitance 202. Afterward, a signal based on the electric charge generated in the PD 103 is read out.

In readout of a signal based on the electric charge generated in the PD 103, the gain control switch 204 is turned on, and the sum of the capacitance of the FD capacitance 202 and the capacitance of the capacitance element 203 is treated as the FD capacitance. This makes it possible to transfer more electrons as compared with a case where the FD capacitance 202 alone is used as the FD capacitance.

The read-out signal based on the electric charge generated in the PD 102 and the read-out signal based on the electric charge generated in the PD 103 are added together in signal processing in a subsequent step, producing a signal with a wider dynamic range as compared with a case where the photoelectric conversion unit of the pixel 100 has a single PD in it. Thus, the dynamic range of a pixel can be improved using the photoelectric conversion units differing in sensitivity to light from each other. In addition, the signals from the PD 102 and the PD 103 are based on the electric charge accumulated at the same timing, which means that the added signals are also signals having no difference in time.

Further, such a pixel circuit will allow a dynamic range to be expanded through reading out three types of signal. A signal based on electric charge accumulated in a first photodiode PD1 and a signal based on electric charge accumulated in a second photodiode PD2 each are read out using the FD capacitance 202. Further, a signal based on electric charge overflowing from the second photodiode PD2 and accumulated in the FD portion and the capacitance element 203 is read out using the sum of the capacitance of the FD capacitance 202 and the capacitance of the capacitance element 203, providing a wider dynamic range of the pixel.

A structure of the pixel and the incidence of light on the pixel according to the present exemplary embodiment will be described with reference to FIGS. 3 to 5.

FIG. 3 is a schematic diagram illustrating a schematic configuration of the photoelectric conversion unit 101. As described above, the area of the PD 102 is smaller than that of the PD 103 and surrounded by the PD 103. In FIG. 3, each pixel has the same total area of the PD 102 and the PD 103 regardless of the area ratio, but a pixel different in the total area may be used. The same total area here means that the difference in area between two pixels is less than or equal to 5% error. In one or more embodiments, the difference is less than or equal to 3% error.

FIG. 4 and FIG. 5 are diagrams each schematically illustrating collection of light rays on each pixel passing through a lens on a camera. FIG. 4 is a diagram with a small F-number of the lens and with the diaphragm of the lens open, and FIG. 5 is a diagram with a large F-number of the lens and with the diaphragm narrow.

A microlens is disposed nearer the light receiving surface of each pixel, and condenses light rays passing through the lens on the photodiodes.

As illustrated in FIG. 4, a wide angular range of the light rays incident on the microlens with a small F-number of the lens leads to a wide light condensing range of the microlens on the pixel, and the light rays are incident on the entire light receiving portion of the pixel. On the other hand, as illustrated in FIG. 5, a large F-number of the lens limits the light rays incident on the microlens in the vertical direction relative to the pixel, and the light condensing range of the microlens on the pixel is mainly within the pixel center.

In a photoelectric conversion apparatus of a pixel with a specific area ratio in the camera, incident light with a large F number concentrates on the center of the pixel, increasing the proportion of the light condensing on the PD 102 to that on the PD 103. In some cases, no light is incident on the PD 103.

To address such an issue, the photoelectric conversion apparatus according to the present exemplary embodiment has a plurality of area ratios between the PD 102 and the PD 103 in each pixel. In other words, the pixels of the photoelectric conversion apparatus include two or more pixels varying in the area ratio between the PD 102 and the PD 103. This allows light to be incident on both the PD 102 and the PD 103 in some area ratio pixels among the pixels varying in the area ratio even if light collection varies with the F number of the lens, generating a signal with a wide dynamic range stably. This also allows selection of pixels to be used to form an image, depending on, for example, whether a specific threshold is exceeded with the F-number.

In the present exemplary embodiment, the PD 103 surrounds the PD 102, and the optical center of the PD 102 and that of the PD 103 substantially aligns with each other. This leads to less difference between the signals of the PDs 102 and 103 in the expansion of a dynamic range using a signal based on electric charge converted in the PD 102 and a signal based on electric charge converted in the PD 103, making correction easy. The optical axis of each pixel can be set in such a range that light is incident on the PD 102 even with the maximum F-number of the lens, the least number of light rays incident on the pixel. To be more specific, the distance between the optical centers of the PD 102 and the PD 103 is less than the distance equal to 10% of the diameter of the pixel.

Figure 6:
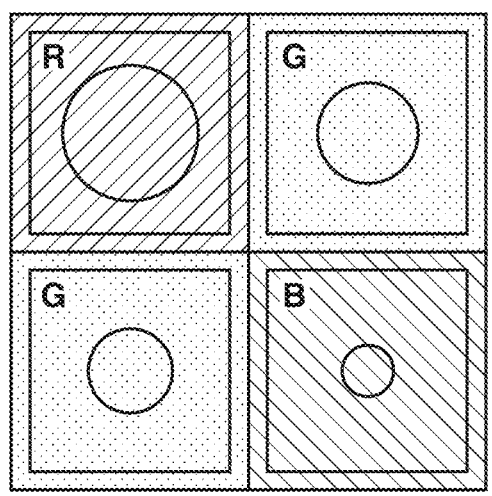
FIG. 6 is a diagram schematically illustrating a planar structure of the photoelectric conversion apparatus according to the first exemplary embodiment.
Figure 7:
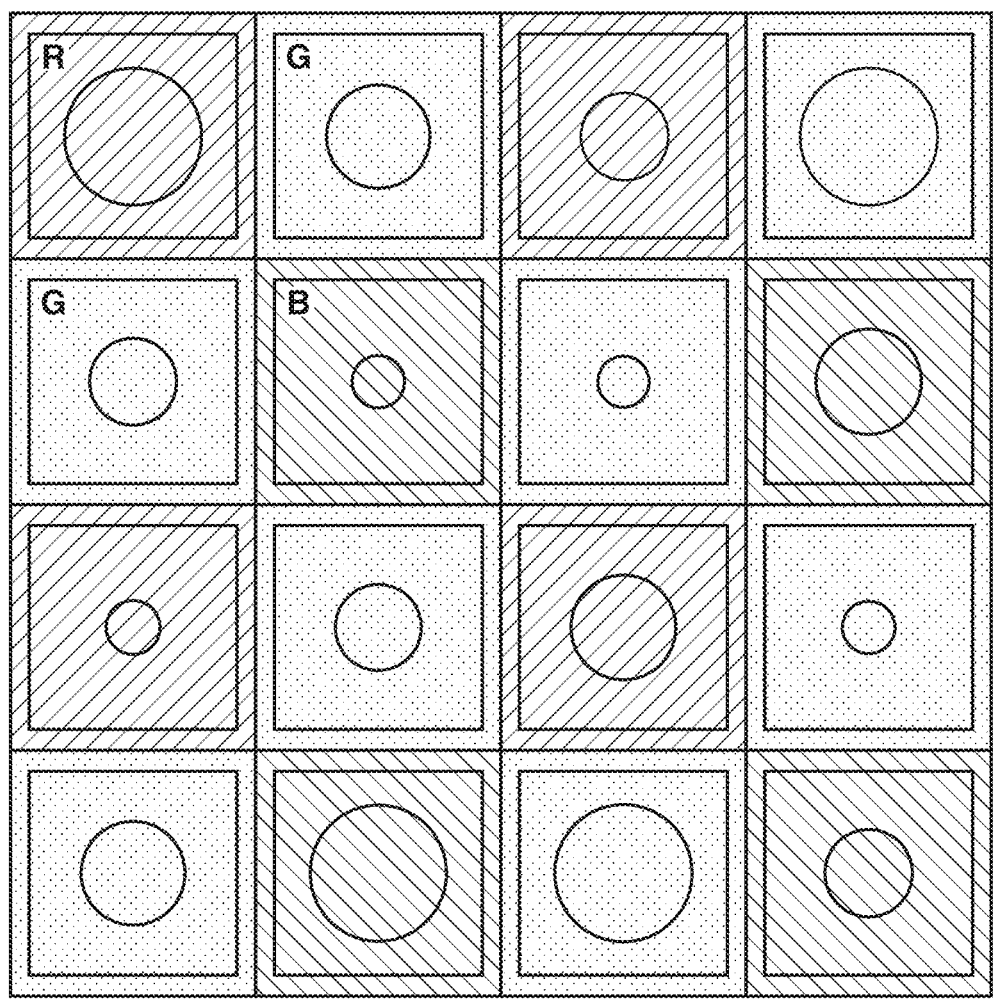
FIG. 7 is a diagram schematically illustrating a planar structure of the photoelectric conversion apparatus according to the first exemplary embodiment.
Figure 8:
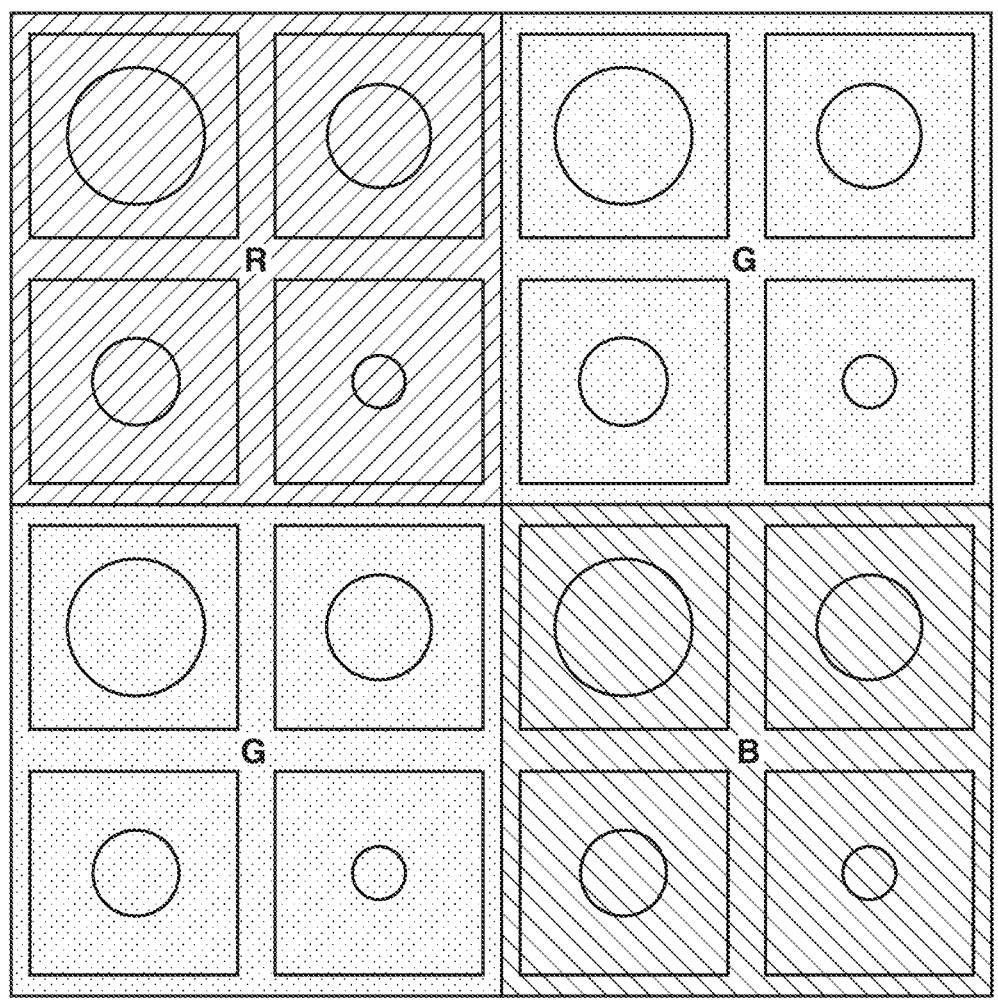
FIG. 8 is a diagram schematically illustrating a planar structure of the photoelectric conversion apparatus according to the first exemplary embodiment.

FIG. 6 to FIG. 8 each schematically illustrate an arrangement of spectral filters in the first exemplary embodiment.

In FIG. 6, a spectral filter for the visible-light wavelength region of one specific color of the three colors red, blue, and green (expressed as R, B, and G, respectively, in FIG. 6) is mounted to each pixel. Although FIG. 6 illustrates an example of an arrangement of red, blue, and green spectral filters, a spectral filter corresponding to white light or infrared light may be further disposed. For white light, a resin can be disposed instead of filters with spectral characteristics of visible light or infrared light. Such an example is also treated as an example of a spectral filter, unless otherwise specified in the present specification. Further, for a white light filter, a filter making it difficult to transmit infrared light (including near-infrared light) with no spectral characteristics of visible light may be used. In FIG. 6, a spectral filter corresponding to the same color (wavelength region) is mounted to each of the pixels with a common light receiving area ratio within the pixel array. In this case, the number of combinations of the light receiving area ratio between the PD 102 and the PD 103 and the color corresponding to the spectral filter is one, allowing the pixels to be easily used as pixels for the dynamic range expansion.

However, in the case of FIG. 6, pixels easily used for and pixels not easily used for the dynamic range expansion depending on the F-number each tend to be concentrated on a specific color.

FIG. 7 illustrates an example of an arrangement of red, blue, and green spectral filters in the Bayer array. FIG. 7 illustrates an R, G, and B arrangement on the pixels in two rows and two columns, and the spectral filters are arranged similarly on the other pixels in the Bayer array. As illustrated in FIG. 7, the combination of a pixel and a spectral filter is changed depending on the location, and the pixels arranged under the spectral filters corresponding to the same color have different area ratios. This configuration allows the pixels for any color to be used more easily for dynamic range expansion.

The wavelength ranges of the spectral filters for a common color do not match perfectly with one another. At least the peak wavelengths of transmittance of the spectral filters for visible light may overlap one another. The infrared light (IR) filter selectively transmits near-infrared light.

Further, as illustrated in FIG. 8, the color of the spectral filter mounted over pixels may be changed by plural pixels, changing the light receiving area ratio pattern of the pixels arranged under the spectral filter. This method allows one color spectral filter to cover all the light receiving area ratio patterns. For example, a quad Bayer array may be used: one color spectral filter is disposed over four pixels in two rows and in two columns, adjacent to one another, and the color varies by four pixels as one unit.

First Modification

A first modification of the first exemplary embodiment will be described with reference to FIG. 9 and FIG. 10.

Figure 9:
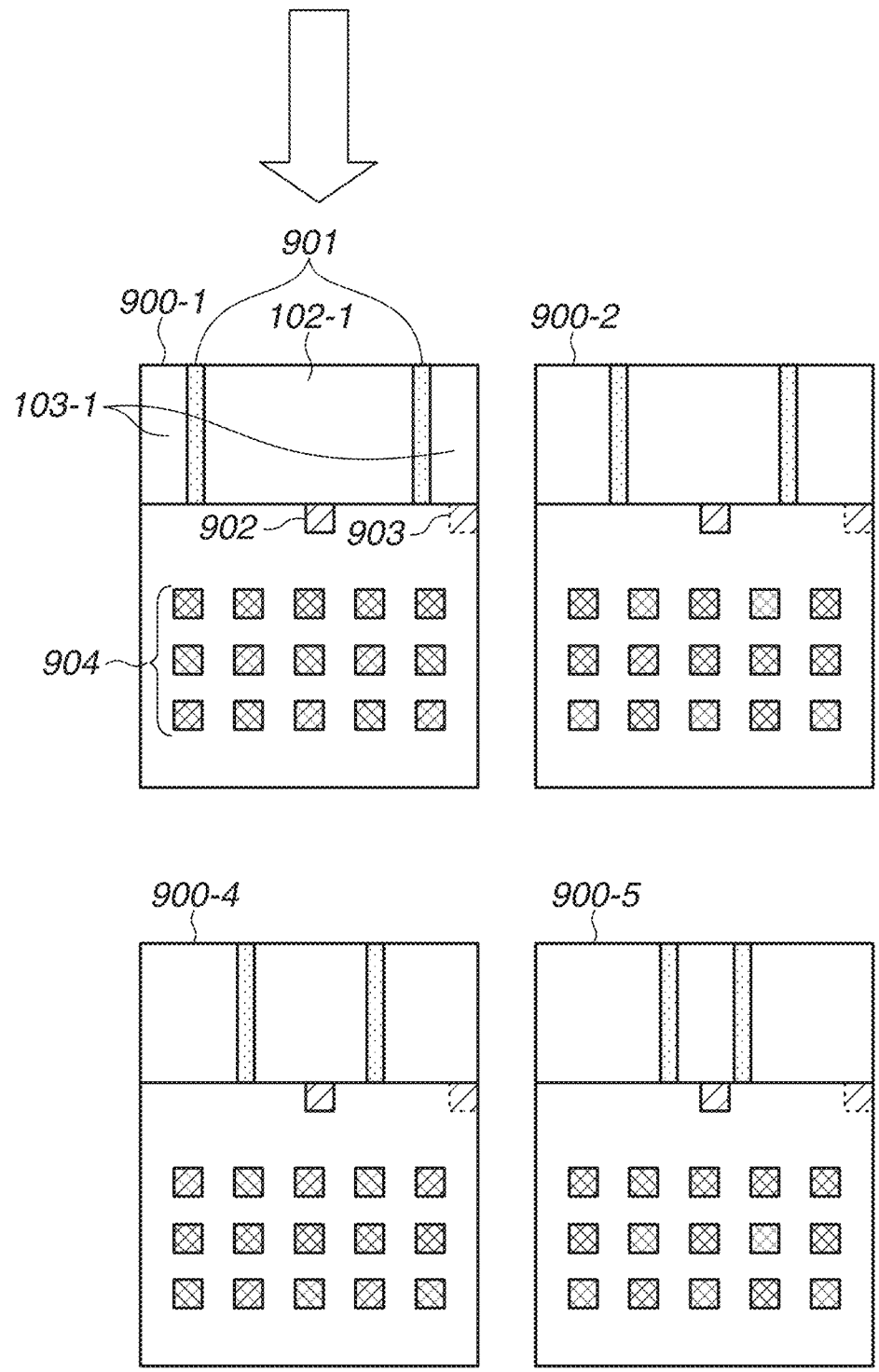
FIG. 9 is a diagram schematically illustrating a sectional structure of the photoelectric conversion apparatus according to the first exemplary embodiment.

FIG. 9 is a diagram schematically illustrating cross-sections of pixels according to the first modification of the first exemplary embodiment. Each pixel 900 includes a semiconductor layer including the photoelectric conversion unit 101, and a wiring layer including wiring 904.

As illustrated in FIG. 9, light is incident on the photoelectric conversion unit 101 in the semiconductor layer of the pixel 900. The semiconductor layer has the photoelectric conversion unit 101 as a photodiode unit and a pixel separation layer 901 that divides the photoelectric conversion unit 101 into two the PD 102 and the PD 103.

The wiring layer including the wiring 904 is connected to the surface opposite to the light receiving surface of the photoelectric conversion unit layer. The wiring 904 includes a transfer transistor 902 of the PD 102, a transfer transistor 903 of the PD 103, a control line, an output line, and a power supply line.

FIG. 10 is a schematic plan view of pixels and transfer transistors according to the first modification of the first exemplary embodiment. The wiring 904 is omitted. An element isolation portion 905 is disposed by a fixed width to the next pixel, separating pixels.

Here, the element isolation portion 905 includes an element isolation portion 905-1 between a pixel 900-1 and a pixel 900-2, and an element isolation portion 905-2 between the pixel 900-2 and a pixel 900-3.

The four pixels illustrated in FIG. 10 vary in the area ratio between the PD 102 and the PD 103, but the transfer transistors 902 and 903 in each of the pixels are at the same relative positions within the photoelectric conversion unit 101, irrespective of the positions of the pixel separation layers in all the pixels. For example, in the cross-section of each of the pixels in FIG. 9, the positions of the transfer transistors of each of the pixels are always the pixel center and a pixel end portion. The pixel end portion is defined by the border between the element isolation portion and the pixel.

In other words, the distance between the transfer transistor 902 of the pixel 900-1 and the element isolation portion 905-1 and the distance between the transfer transistor 902 of the pixel 900-2 and the element isolation portion 905-2 are equal. Similarly, the distance between the transfer transistor 903 of the pixel 900-1 and the element isolation portion 905-1 and the distance between the transfer transistor 903 of the pixel 900-2 and the element isolation portion 905-2 are equal to each other.

The wiring 904 can be formed in a similar manner in all the pixels by thus arranging the transfer transistors at the same positions irrespective of the area ratio between the light receiving portions in each pixel. The wiring layer can be formed by a fixed repeat unit, making it easy to design a MOS and wiring in a pixel.

Second Modification

A second modification of the first exemplary embodiment will be described with reference to FIG. 11 and FIG. 12.

FIG. 11 and FIG. 12 are diagrams each schematically illustrating cross-sections of pixels according to the second modification of the first exemplary embodiment. The semiconductor layers of the pixels illustrated in each of FIGS. 11 and 12 each have the photoelectric conversion unit 101 as a photodiode unit, and the pixel separation layer 901 that divides the photoelectric conversion unit 101 into two the PD 102 and the PD 103.

The pixel separation layer 901 is formed by ion implantation to have the same area ratio on the wiring layer in every pixel, even though the area ratio between the light receiving portions of the PD 102 and the PD 103 varies from pixel to pixel. The pixel separation layer 901 is formed of, specifically, a semiconductor region having a conductivity type opposite to the conductivity type of the pixel, or an insulator. In such a configuration, the transfer transistor 902 of the PD 102 can be formed at the same position within the pixel irrespective of the area ratio between the light receiving surfaces in each pixel. For example, in the cross-section that divides the pixel into two as illustrated in each of FIGS. 11 and 12, the distance between the end portion of each pixel having the border defined by the element isolation portion and each of the transfer transistors can be the same. In other words, the distance between the transfer transistor and the element isolation portion that isolates the pixel is equal in the pixels. Such a configuration can reduce the difference in the state of the charge transfer between the pixels different in the area ratio between the light receiving portions.

Third Modification

A third modification of the first exemplary embodiment will be described with reference to FIG. 13 and FIG. 14.

FIG. 13 is a diagram schematically illustrating cross-sections of pixels according to the third modification of the first exemplary embodiment, and FIG. 14 illustrates a schematic plan view of pixels and transfer transistors of the present modification.

In this modification, whereas the transfer transistor 903 of the PD 103 is at the same position within each pixel irrespective of the area ratio between the light receiving portions in each pixel, the position of the transfer transistor 902 of the PD 102 varies depending on the size of the PD 102. As the position of the transfer transistor 902 varies from pixel to pixel, the design of the wiring 904 also varies from pixel to pixel. In the pixel structure of the present modification, the area ratio in the light receiving portion and the area ratio on the semiconductor layer between the PD 102 and the PD 103 can be equal to each other, and the state of the charge transfer between the pixels varying in the area ratio between the light receiving portions can remain unchanged, as illustrated in FIG. 13.

FIG. 15 illustrates an entire pixel array of the first exemplary embodiment.

As illustrated in FIG. 15, a part of the pixel array is covered with a light shielding portion 1501, and the covered pixels can be used as light shielded pixels for correction such as shading of the entire pixel array. The light shielding portion 1501 faces the light receiving surface of the light receiving pixels used as the light shielded pixels. For the pixel array, the same pixel pattern is repeated regardless of whether the pixels are covered with the light shielding portion 1501. FIG. 15 illustrates a pattern in which one set of four different pixels varying in the area ratio is repeated.

Such a pixel arrangement allows correction calculation based on the pixels covered with the light shielding portion 1501.

According to the first exemplary embodiment described above, a signal with an expanded dynamic range can be generated irrespective of the F-number of the lens.

A second exemplary embodiment of the disclosure will be described. In the present exemplary embodiment, the shape of a photoelectric conversion unit is different from that of the above-described exemplary embodiment.

A photoelectric conversion apparatus, a pixel circuit configuration, and operation thereof in the second exemplary embodiment are similar to those in the first exemplary embodiment and thus will not be described, and a part different from the first exemplary embodiment will be mainly described.

Figure 16:
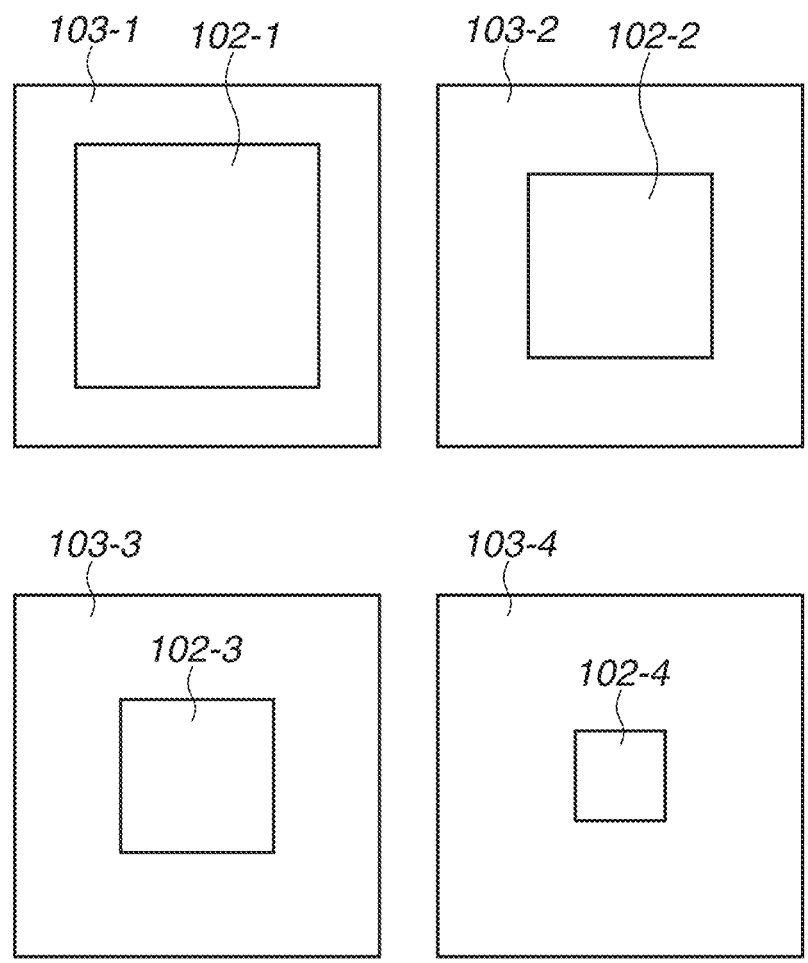
FIG. 16 is a diagram schematically illustrating a planar structure of a photoelectric conversion apparatus according to a second exemplary embodiment.

FIG. 16 is a schematic diagram of a pixel configuration of the second exemplary embodiment. A configuration in which a photoelectric conversion unit 101 of a pixel 100 includes a PD 102 and a PD 103 is similar to the pixel configuration of the first exemplary embodiment, but the shape of the PD 102 is a rectangle, and the PD 102 and the PD 103 are similar in shape, making signal processing easy.

A camera in the present exemplary embodiment allows generation of a signal with an expanded dynamic range, irrespective of the F-number of the lens, as with the first exemplary embodiment.

A third exemplary embodiment will be described with reference to FIGS. 17 to 19.

In the present exemplary embodiment, the shape of a photoelectric conversion unit is different from those of the above-described exemplary embodiments, and a pixel can also be used for a signal for phase difference autofocus (AF). A photoelectric conversion apparatus, a pixel circuit configuration, and operation thereof in the third exemplary embodiment are similar to those in the first exemplary embodiment and thus will not be described, and a part different from the first exemplary embodiment will be mainly described.

Figure 17:
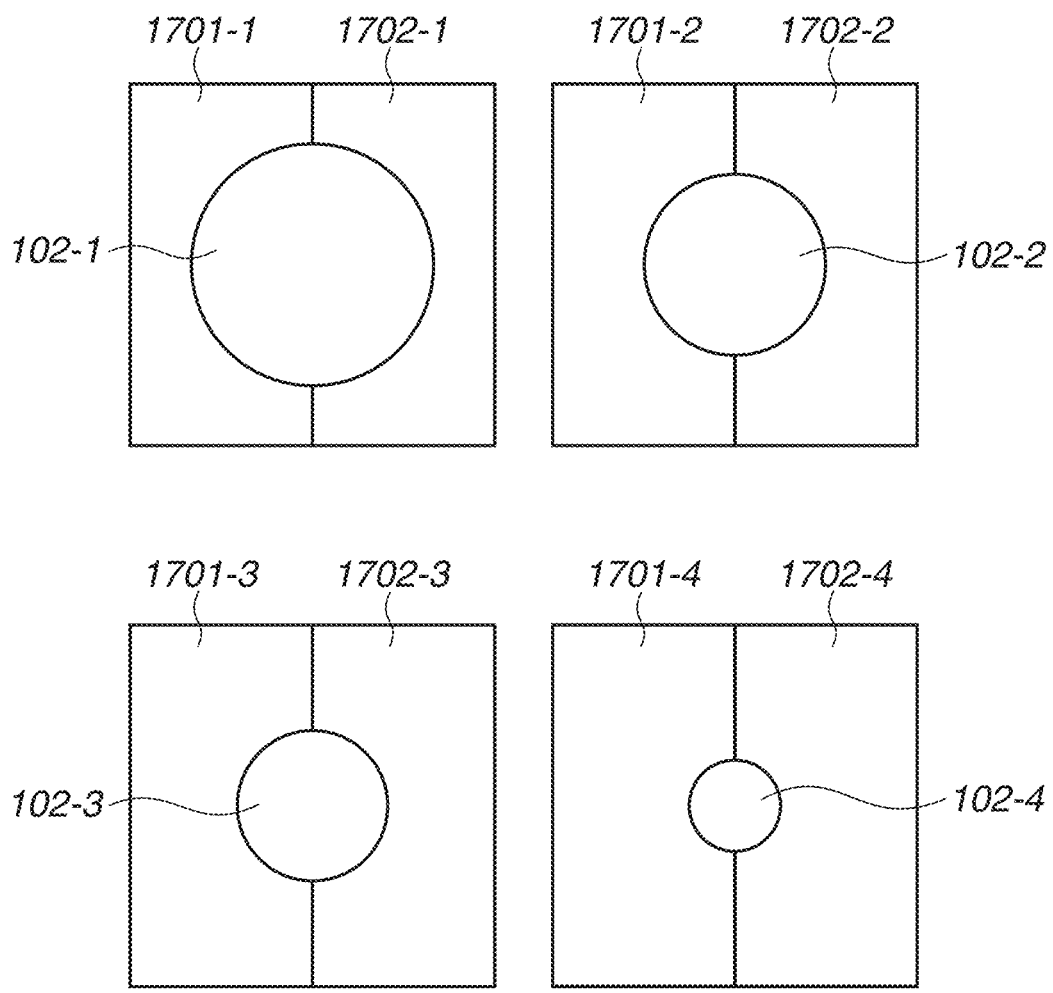
FIG. 17 is a schematically illustrating a planar structure of a photoelectric conversion apparatus according to a third exemplary embodiment.

FIG. 17 is a schematic diagram of a planar structure of pixels of the third exemplary embodiment.

A PD 102 included in a photoelectric conversion unit 101 of a pixel 100 is similar to that in the pixel configuration of the first exemplary embodiment, but a PD 103 is divided into two PDs 1701 and 1702.

Figure 18:
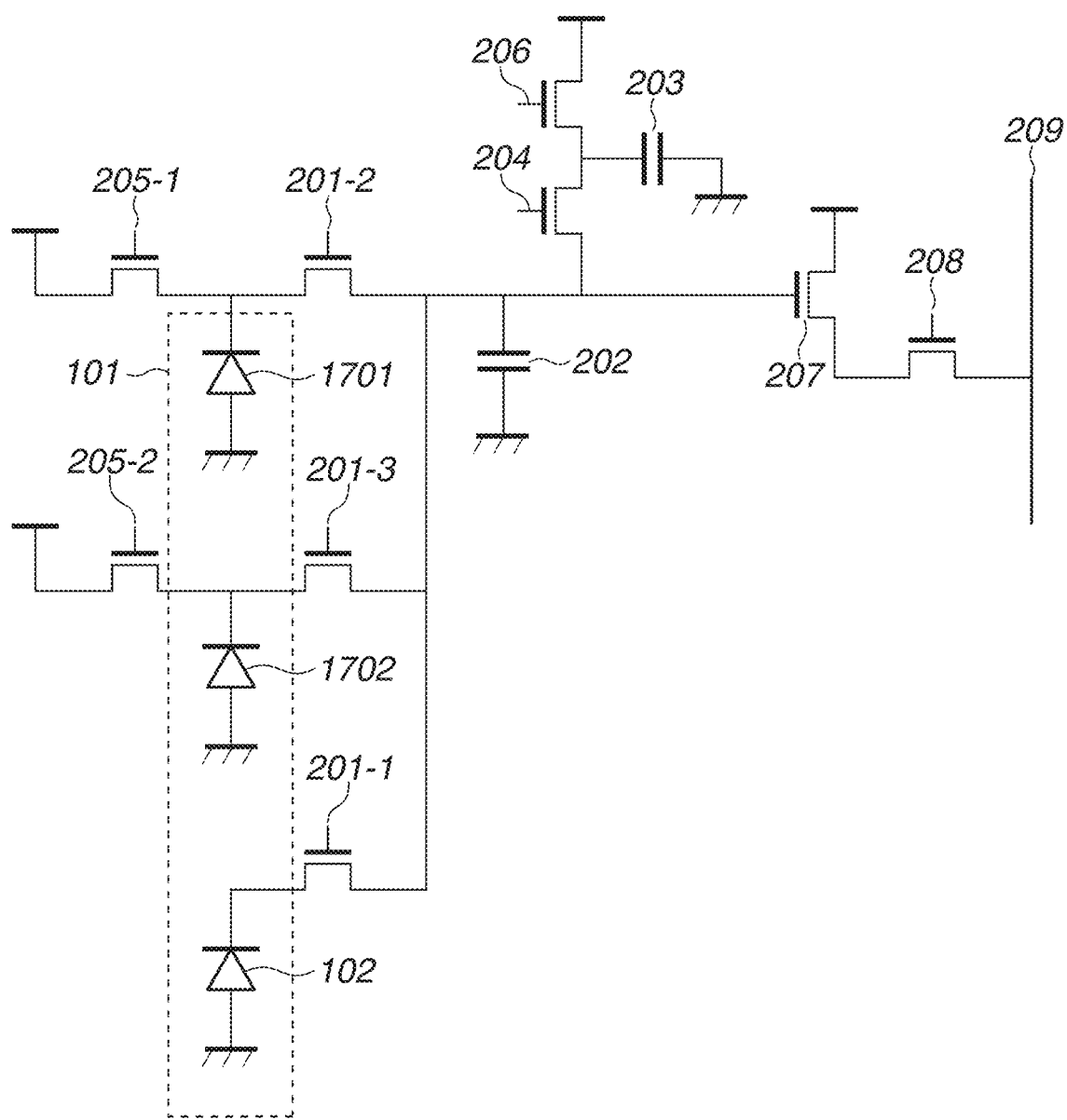
FIG. 18 is a configuration example of a pixel circuit of the photoelectric conversion apparatus according to the third exemplary embodiment.

FIG. 18 illustrates an equivalent circuit of a pixel circuit configuration of the third exemplary embodiment.

As the PD 103 is divided into the two PDs 1701 and 1702, a transfer transistor 201 and an overflow switch 205 are connected to the cathodes of the PD 1701 and the PD 1702. Signal readout operation is similar to that in the first exemplary embodiment, and readout of electric charge of the PD 102, readout of electric charge of the PD 1701, and readout of electric charge of the PD 1702 are sequentially performed.

Figure 19:
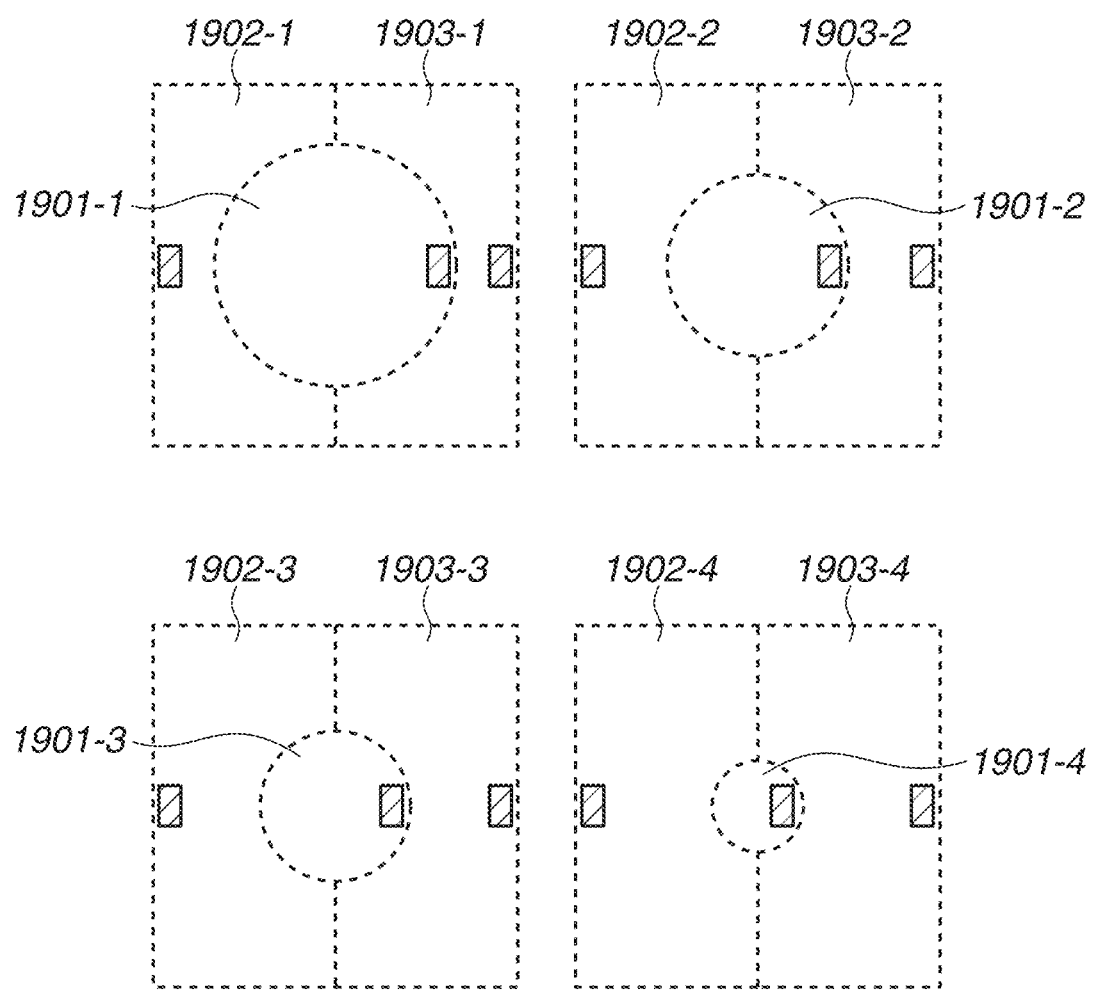
FIG. 19 is a diagram schematically illustrating a planar structure in sight of the back surface of a substrate of the photoelectric conversion apparatus according to the third exemplary embodiment.

FIG. 19 illustrates a schematic plan view of pixels and transfer transistors of the third exemplary embodiment. Wiring 904 is omitted.

In the present exemplary embodiment, a transfer transistor 1901 is connected to the PD 102, a transfer transistor 1902 is connected to the PD 1701, and a transfer transistor 1903 is connected to the PD 1702. In FIG. 19, the position of the transfer transistor 1901 varies depending on the area of the PD 102, but may be formed at a fixed position irrespective of the area.

According to the present exemplary embodiment, a signal with an expanded dynamic range can be generated irrespective of the F-number of the lens as with the first exemplary embodiment, and acquisition of signals of the PD 1701 and the PD 1702 as separate signals allows the pixels to be also used for phase difference AF.

A fourth exemplary embodiment will be described with reference to some of the drawings.

In the present exemplary embodiment, the shape of a photoelectric conversion unit is different from those of the above-described exemplary embodiments, and the dynamic range of a signal for phase difference AF can be expanded. A photoelectric conversion apparatus, a pixel circuit configuration, and operation thereof in the fourth exemplary embodiment are similar to those in the first exemplary embodiment and thus will not be described, and a part different from the first exemplary embodiment will be mainly described.

Figure 20:
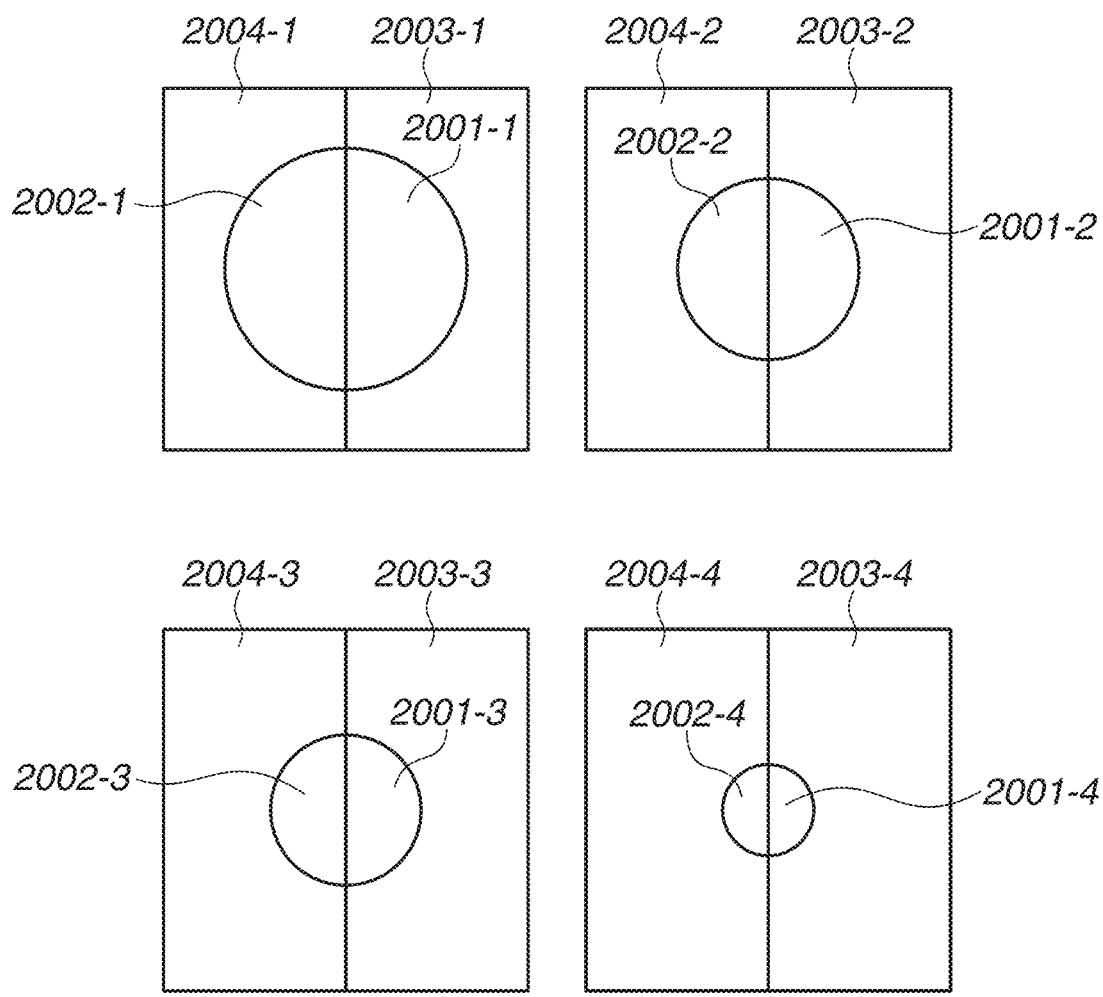
FIG. 20 is a diagram schematically illustrating a planar structure of a photoelectric conversion apparatus according to a fourth exemplary embodiment.

FIG. 20 illustrates a pixel configuration of the fourth exemplary embodiment. A PD 102 is divided into two pixels 2001 and 2002, and a PD 103 is divided into two pixels 2003 and 2004 as with the third exemplary embodiment.

Figure 21:
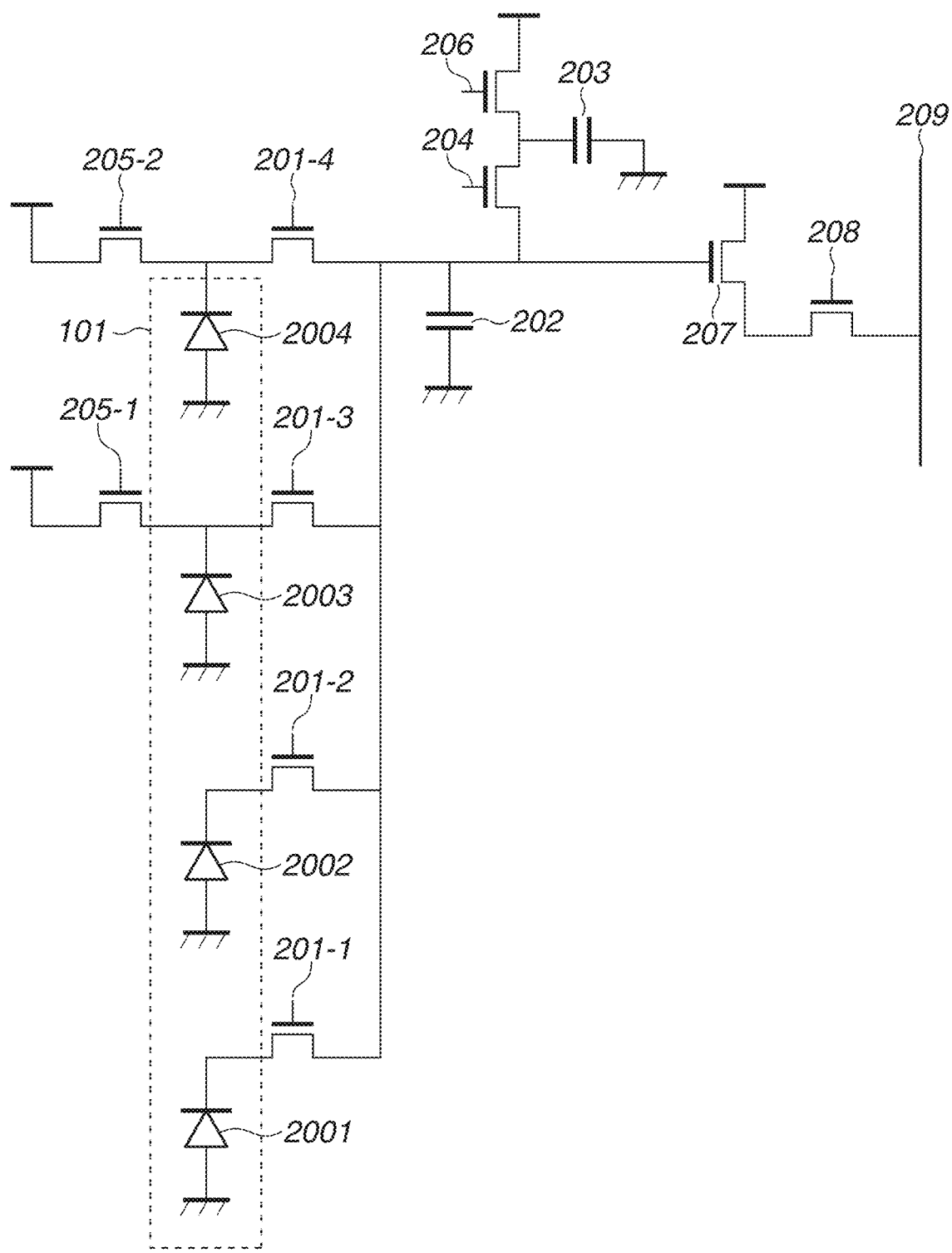
FIG. 21 is a configuration example of a pixel circuit of the photoelectric conversion apparatus according to the fourth exemplary embodiment.

FIG. 21 illustrates a pixel circuit configuration of the fourth exemplary embodiment. As the PD 102 is divided into the two pixels 2001 and 2002, a transfer transistor 201 is connected to each of the pixels 2001 and 2002. The pixels 2003 and 2004 are similar to those of the third exemplary embodiment.

Signal readout operation is similar to that in the first exemplary embodiment, and readout from the pixel 2001, readout from the pixel 2002, readout from the pixel 2003, and readout from the pixel 2004 are sequentially performed.

Figure 22:
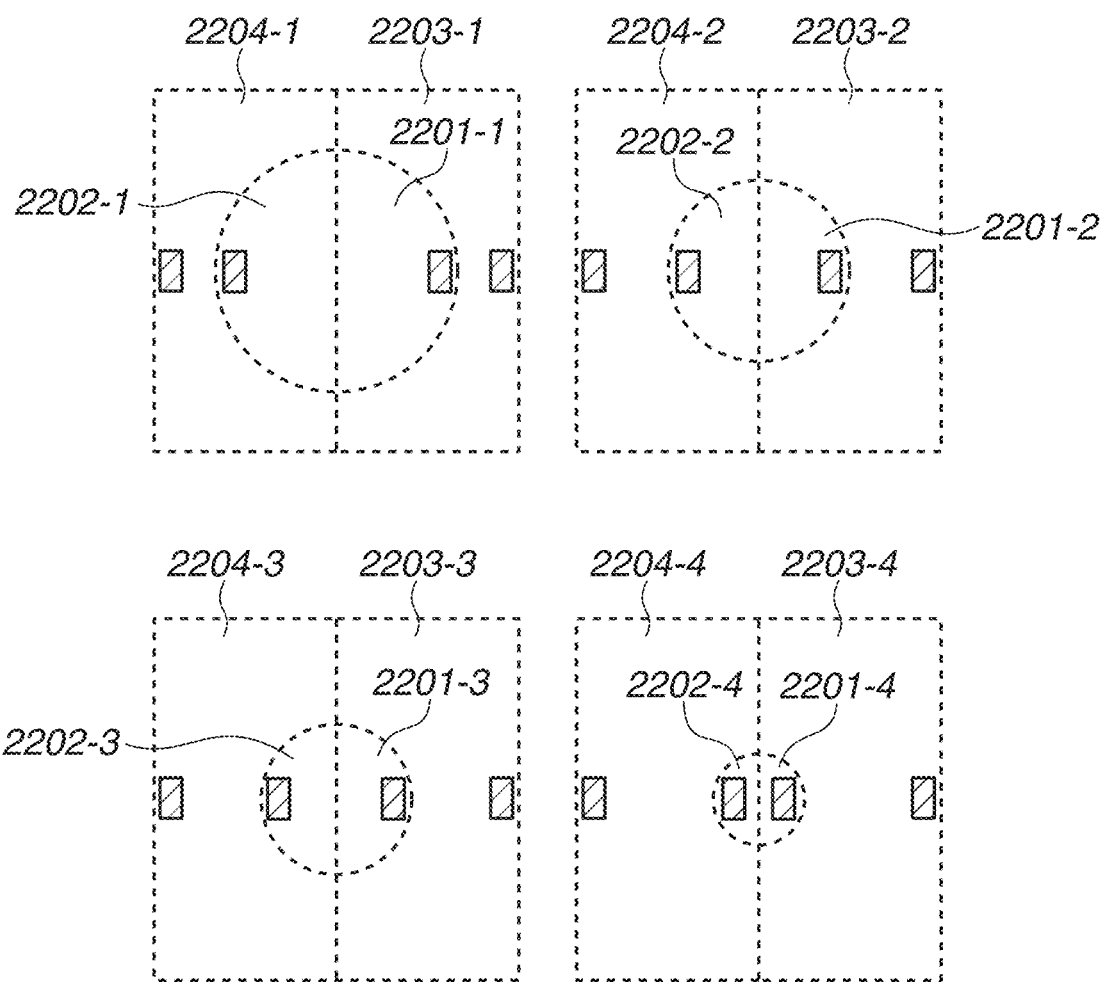
FIG. 22 is a diagram schematically illustrating a planar structure in sight of the back surface of a substrate of the photoelectric conversion apparatus according to the fourth exemplary embodiment.

FIG. 22 illustrates a schematic plan view of pixels and transfer transistors of the fourth exemplary embodiment. Wiring 904 is omitted.

In the present exemplary embodiment, a transfer transistor 2201, a transfer transistor 2202, a transfer transistor 2203, and a transfer transistor 2204 are connected to the pixel 2001, the pixel 2002, the pixel 2003, and the pixel 2004, respectively. In FIG. 22, the transfer transistors 2201 and 2202 vary in position depending on the areas of the pixels 2001 and 2002, but each may be formed at a fixed location irrespective of the area.

According to the present exemplary embodiment, as with the first exemplary embodiment, a signal with an expanded dynamic range can be generated irrespective of the F-number of the lens, and the pixel can also be used for phase difference AF, allowing a signal for phase difference AF to have an expanded dynamic range.

A fifth exemplary embodiment will be described with reference to some of the drawings.

In the present exemplary embodiment, the shape of a photoelectric conversion unit is different from those of the above-described exemplary embodiments, and a pupil division direction on a signal for phase difference AF can be selected. A photoelectric conversion apparatus, a pixel circuit configuration, and operation thereof in the fifth exemplary embodiment are similar to those in the first exemplary embodiment and thus will not be described, and a part different from the first exemplary embodiment will be mainly described.

Figure 23:
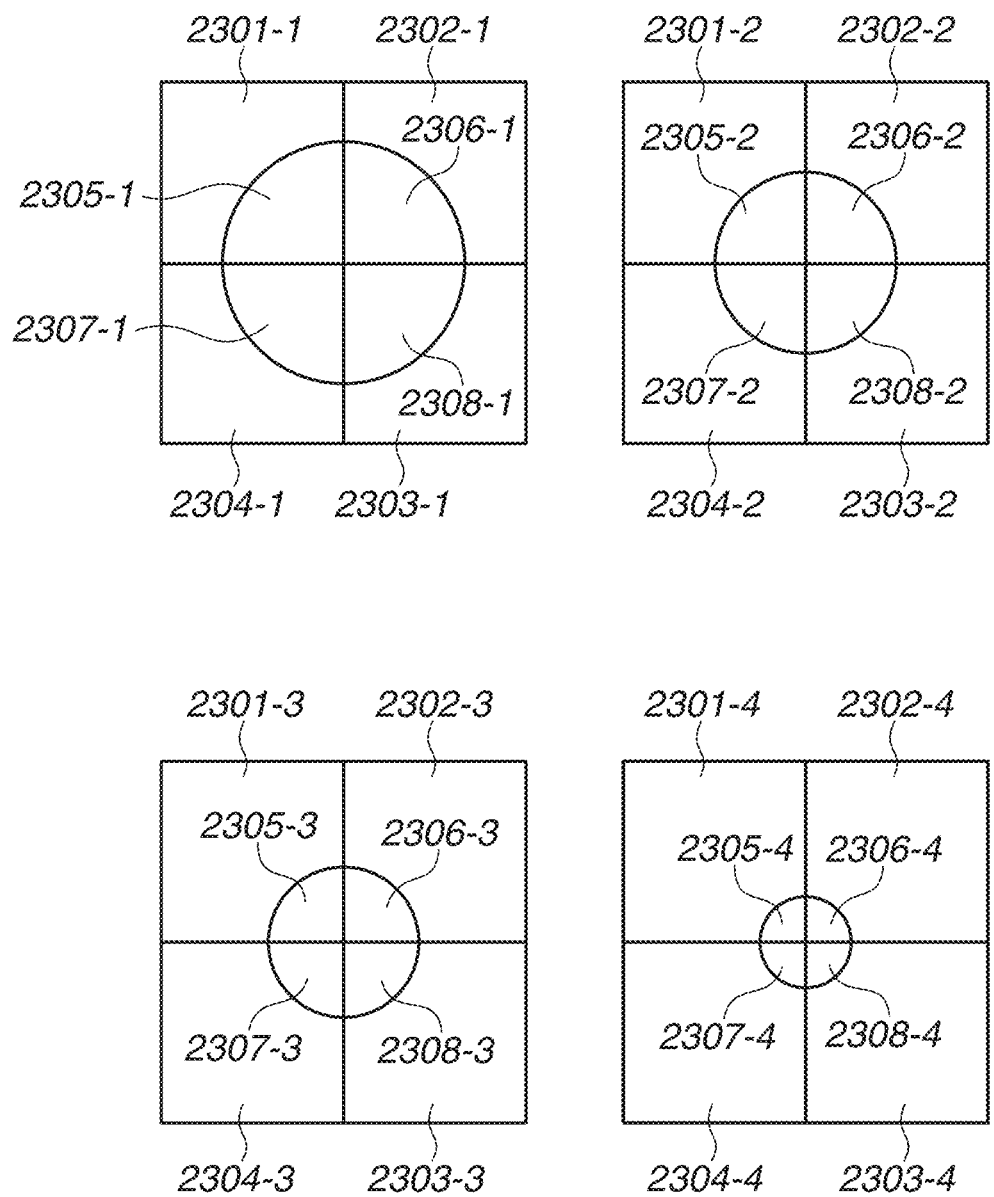
FIG. 23 is a diagram schematically illustrating a planar structure of a photoelectric conversion apparatus according to a fifth exemplary embodiment.

FIG. 23 illustrates a pixel configuration of the fourth exemplary embodiment. A PD 103 is divided, as with the third exemplary embodiment, into four PDs 2301, 2302, 2303, and 2304, and a PD 102 is divided into four pixels 2305, 2306, 2307, and 2308.

There are two methods for distance measurement based on phase difference detection: one method of detecting a phase difference by dividing a pupil image in the lateral (horizontal) direction (i.e., vertical line detection), and the other method of detecting a phase difference by dividing a pupil image in the vertical (perpendicular) direction (i.e., horizontal line detection). In general, the vertical line detection is used in many cases, but can be difficult for an object including many horizontal lines.

In the present exemplary embodiment, a configuration is used that the vertical line detection and the horizontal line detection are switchable for a pixel 100. The vertical line detection or the horizontal line detection can be performed by using two of the four photoelectric conversion units of the PD 102 and the PD 103. This allows the vertical line detection and/or the horizontal line detection to be selected and performed.

According to the present exemplary embodiment, a signal with an expanded dynamic range can be generated irrespective of the F-number of the lens, and a pixel can also be used as a pixel that allows selection of a pupil division direction for phase difference AF.

Figure 24:
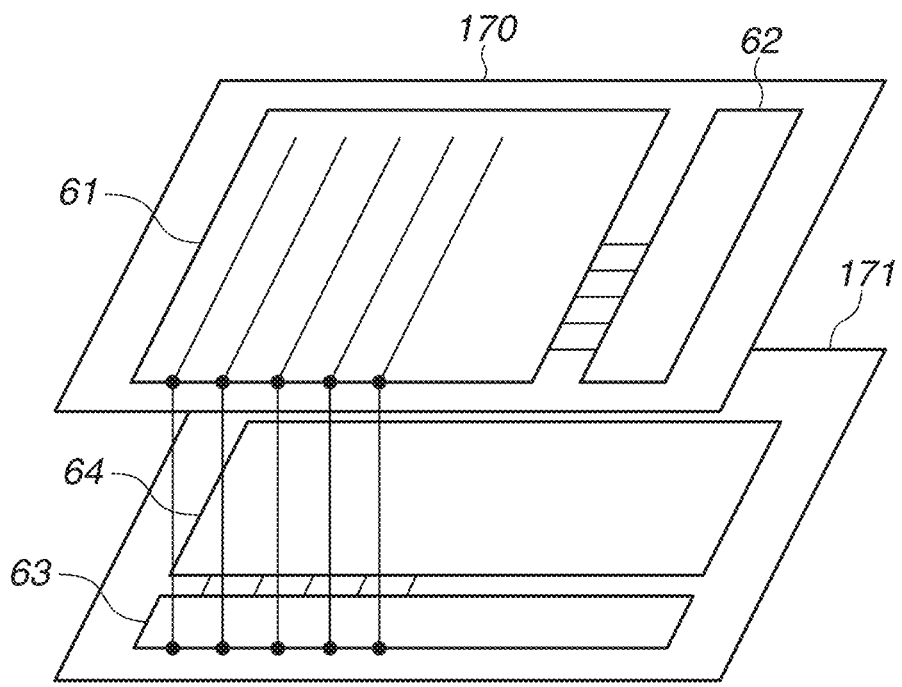
FIG. 24 is a schematic diagram of a photoelectric conversion apparatus with a layered structure.

The first exemplary embodiment to the fifth exemplary embodiment have been described above with reference to the schematic diagram of the photoelectric conversion apparatus illustrated in FIG. 1. However, in one or more embodiments, a layered structure of two or more semiconductor substrates joined together with circuits thereon is used, as illustrated in FIG. 24. A photoelectric conversion apparatus with a layered structure illustrated in FIG. 24 has a first substrate 170 and a second substrate 171.

The photoelectric conversion apparatus with a layered structure illustrated in FIG. 24 is an example in which the configuration of FIG. 1 is divided into two substrates. In this example, a pixel region 61 and a timing generator 62 are disposed on the first substrate 170. A column signal processing circuit 63 and an arithmetic processing unit 64 are disposed on the second substrate 171. The photoelectric conversion apparatus with the layered structure in FIG. 24 is merely an example, and does not limit the disclosure. For example, the timing generator 62 on the first substrate 170 may be disposed on the second substrate 171. Further, the pixels of the first substrate 170 and the column signal processing circuit 63 of the second substrate 171 are electrically connected to each other by each column of the pixels in the example illustrated in FIG. 24. In one or more embodiments, the column signal processing circuit on the second substrate is connected to each of the pixels. The layered structure of the two substrates has been described with reference to FIG. 24, but a layered structure consisting of three or more substrates may be provided by, for example, further dividing the circuit, or adding a circuit and a function.

Figure 25:
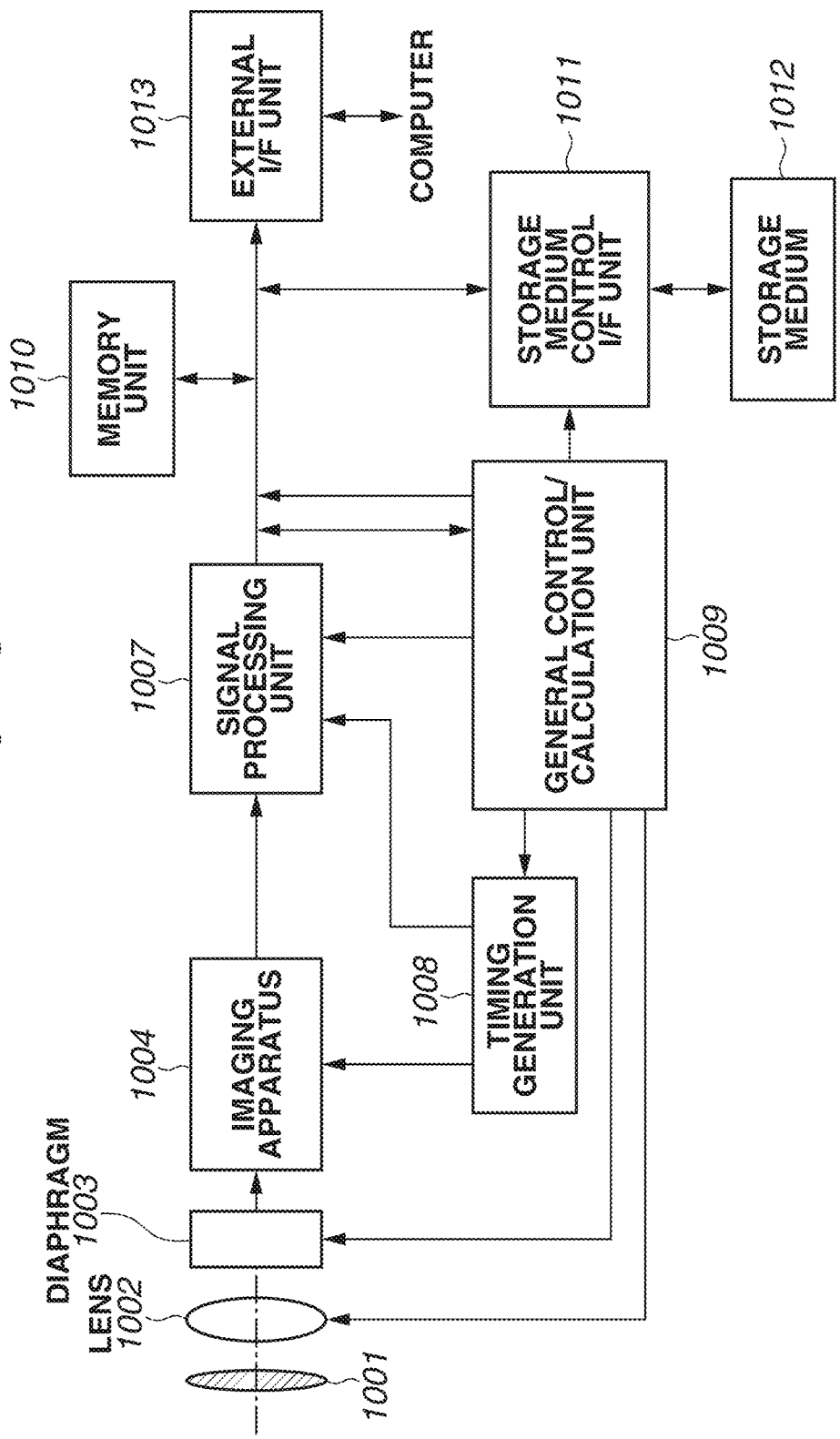
FIG. 25 is a block diagram illustrating a schematic configuration of an imaging system according to a sixth exemplary embodiment.

A photoelectric conversion system according to a sixth exemplary embodiment will be described with reference to FIG. 25. FIG. 25 is a block diagram illustrating a schematic configuration of the photoelectric conversion system according to the present exemplary embodiment.

The photoelectric conversion apparatus described in the first to fifth exemplary embodiments described above is applicable to various types of photoelectric conversion system. Examples of photoelectric conversion systems to which the photoelectric conversion apparatus is applicable include digital still cameras, digital camcorders, surveillance cameras, copiers, facsimile machines, mobile phones, on-vehicle cameras, and observation satellites. Further, a camera module including an optical system such as a lens and an imaging apparatus is also included in the examples of photoelectric conversion systems. FIG. 25 illustrates a block diagram of a digital still camera as one of these examples.

The photoelectric conversion system illustrated in FIG. 25 includes an imaging apparatus 1004 as an example of the photoelectric conversion apparatus, and a lens 1002 to focus an image of an object on the imaging apparatus 1004. The photoelectric conversion system further includes a diaphragm 1003 for changing the quantity of light passing through the lens 1002, and a barrier 1001 for protecting the lens 1002. The lens 1002 and the diaphragm 1003 constitute an optical system that condenses light on the imaging apparatus 1004. The imaging apparatus 1004 is any of the photoelectric conversion apparatuses in the respective exemplary embodiments described above, and converts an optical image focused by the lens 1002 into an electric signal.

The photoelectric conversion system further includes a signal processing unit 1007 serving as an image generation unit to generate an image by processing the output signal output from the imaging apparatus 1004. The signal processing unit 1007 performs operation of performing various kinds of correction and compression as appropriate and outputting image data. The signal processing unit 1007 may be formed on a semiconductor substrate provided with the imaging apparatus 1004, or may be formed on a semiconductor substrate different from the semiconductor substrate provided with the imaging apparatus 1004. Further, the imaging apparatus 1004 and the signal processing unit 1007 may be formed on the same semiconductor substrate.

The photoelectric conversion system further includes a memory unit 1010 for temporarily storing image data, and an external interface unit (an external I/F unit) 1013 for communicating with an external computer or other devices. The photoelectric conversion system further includes a storage medium 1012 such as a semiconductor memory for storing or reading out image data, and a storage medium control interface unit (a storage medium control I/F unit) 1011 for storing data in or reading out data from the storage medium 1012. The storage medium 1012 may be built in the photoelectric conversion system or may be detachably attached.

The photoelectric conversion system further includes a general control/calculation unit 1009 to perform various calculations and generally control the digital still camera, and a timing generation unit 1008 to output various timing signals to the imaging apparatus 1004 and the signal processing unit 1007. Here, timing signals may be input from the outside, and the photoelectric conversion system may include at least the imaging apparatus 1004 and the signal processing unit 1007 to process output signal output from the imaging apparatus 1004.

The imaging apparatus 1004 outputs an imaging signal to the signal processing unit 1007. The signal processing unit 1007 performs predetermined signal processing on the imaging signal output from the imaging apparatus 1004, and outputs image data. The signal processing unit 1007 generates an image using the imaging signal.

According to the present exemplary embodiment, the above-described configuration allows the photoelectric conversion system with the photoelectric conversion apparatus (the imaging apparatus) of any of the exemplary embodiments described above to be provided.

A photoelectric conversion system and a moving object according to a seventh exemplary embodiment will be described with reference to FIGS. 26A and 26B. FIGS. 26A and 26B are diagrams illustrating a configuration of the photoelectric conversion system and a configuration of the moving object, respectively, according to the present exemplary embodiment.

FIG. 26A illustrates an example of a photoelectric conversion system related to an on-vehicle camera. A photoelectric conversion system 300 includes an imaging apparatus 310. The imaging apparatus 310 is the photoelectric conversion apparatus (the imaging apparatus) according to any of the exemplary embodiments described above. The photoelectric conversion system 300 includes an image processing unit 312 to perform image processing on a plurality of pieces of image data acquired by the imaging apparatus 310, and a parallax acquisition unit 314 to calculate parallax (a phase difference between parallax images) from the pieces of image data acquired in the photoelectric conversion system 300. The photoelectric conversion system 300 further includes a distance acquisition unit 316 to calculate the distance to a target object based on the calculated parallax, and a collision determination unit 318 to determine whether there is a collision possibility based on the calculated distance. Here, the parallax acquisition unit 314 and the distance acquisition unit 316 each are an example of a distance information acquisition unit to acquire distance information about the distance to a target object. In other words, the distance information includes information about parallax, a de-focusing amount, and the distance to a target object. The collision determination unit 318 may determine a collision possibility, using any of these pieces of distance information. The distance information acquisition unit may be formed of an exclusively designed piece of hardware, or of a software module. Further, the distance information acquisition unit may be formed of a field programmable gate array (FPGA) or an application specific integrated circuit (ASIC), or may be formed of the combination of these devices.

The photoelectric conversion system 300 is connected to a vehicle information acquisition apparatus 320 to acquire vehicle information such as vehicle speed, yaw rate, and steering angle. Further, the photoelectric conversion system 300 is connected to a control electronic control unit (ECU) 330 serving as a control unit to output a control signal for generating a braking force acting on the vehicle based on the result of the determination by the collision determination unit 318. The photoelectric conversion system 300 is also connected to a warning apparatus 340 to warn the driver based on the result of the determination by the collision determination unit 318. For example, in response to a high collision possibility as the result of the determination by the collision determination unit 318, the control ECU 330 controls the vehicle to avoid the collision or reduce damage by, for example, braking the vehicle, releasing the accelerator, or reducing the engine output. The warning apparatus 340 warns the user by, for example, generating an alarm sound, displaying warning information on the screen of the car navigation system or vibrating the seat belt or the steering wheel.

In the present exemplary embodiment, the photoelectric conversion system 300 captures images of the surroundings of the vehicle, e.g., images ahead of or behind the vehicle. FIG. 26B illustrates the photoelectric conversion system of capturing images ahead of the vehicle (an imaging range 350). The vehicle information acquisition apparatus 320 transmits instructions to the photoelectric conversion system 300 or the imaging apparatus 310. Such a configuration improves the accuracy of distance measurement.

While the example of control of avoiding collision with other vehicles has been described above, the present exemplary embodiment is also applicable to automatic driving control to follow another vehicle or to keep the vehicle running in the current traffic lane. Further, the photoelectric conversion system is applicable to moving objects (moving apparatuses) such as vessels, airplanes, and industrial robots, as well as vehicles. In addition, the photoelectric conversion system is applicable to a wide range of apparatuses utilizing object recognition, such as an intelligent transport system (ITS), besides moving objects.

Modifications of Exemplary Embodiments

The disclosure is not limited to the above-described exemplary embodiments and can be modified in various ways.

For example, the exemplary embodiments of the disclosure include an example in which a part of the configuration in any of the exemplary embodiments is added to another exemplary embodiment, and an example in which the part is replaced with a part of the configuration of another exemplary embodiment.

The photoelectric conversion systems in the sixth exemplary embodiment and the seventh exemplary embodiment described above each are an example of the photoelectric conversion system to which the photoelectric conversion apparatus is applicable, and the photoelectric conversion system to which the photoelectric conversion apparatus of any of the present exemplary embodiments is applicable is not limited to the configurations illustrated in FIG. 25 and FIGS. 26A and 26B.

The above-described exemplary embodiments are merely illustrative examples in implementing the disclosure, and the technical scope of the disclosure is not to be interpreted restrictively by these exemplary embodiments. In other words, the disclosure can be implemented in various forms without departing from the technical concepts or principal characteristics thereof.

According to the exemplary embodiments of the disclosure, a dynamic range can be expanded irrespective of the F-number of a lens.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-176076, filed Oct. 20, 2020, which is hereby incorporated by reference herein in its entirety.

What is claimed is:

1. An apparatus comprising:
   pixels including a first pixel and a second pixel; and
   a plurality of microlenses,
   wherein each of the pixels has a first conversion unit and a second conversion unit surrounding the first conversion unit,
   wherein the first conversion unit and the second conversion unit each have a light portion to receive light from a corresponding microlens,
   wherein the first conversion unit and the second conversion unit are under the corresponding microlens, and
   wherein a first area ratio between an area of the light portion of the first conversion unit in the first pixel and an area of the light portion of the second conversion unit in the first pixel is different from a second area ratio between an area of the light portion of the first conversion unit in the second pixel and an area of the light portion of the second conversion unit in the second pixel.

2. The apparatus according to claim 1, wherein the first pixel and the second pixel are equal in total of the area of the light portion of the first conversion unit and the area of the light portion of the second conversion unit.

3. The apparatus according to claim 1, wherein the first pixel and the second pixel are adjacent to each other.

4. The apparatus according to claim 3, wherein the pixels are disposed by repeating an array consisting of four pixels including the first pixel and the second pixel and arranged in two rows and two columns.

5. The apparatus according to claim 4, wherein the four pixels vary in the area ratio from one another.

6. The apparatus according to claim 3, wherein a first filter is over a light receiving surface of the first pixel of the pixels, a second filter is over the light receiving surface of the second pixel of the pixels, and the first filter and the second filter each correspond to any one color among red, green, blue, and white.

7. The apparatus according to claim 3, wherein a first filter is over a light receiving surface of the first pixel of the pixels, a second filter is over a light receiving surface of the second pixel of the pixels, and a wavelength at a peak transmittance of the first filter and a wavelength at a peak transmittance of the second filter overlap each other.

8. The apparatus according to claim 3, wherein both a first filter over a light receiving surface of the first pixel of the pixels and a second filter over a light receiving surface of the second pixel of the two or more pixels correspond to an identical wavelength region of light.

9. The apparatus according to claim 1,
wherein the pixels includes the first pixel, the second pixel, and a third pixel,
wherein the conversion apparatus further comprises a first element portion between the first pixel and the second pixel,
wherein the apparatus further comprises a second element portion between the second pixel and the third pixel,
wherein each of the first conversion units is connected to a first transistor to transfer electric charge, and
wherein a distance from an end portion of a gate of the first transistor of the first pixel to a border between the first element portion and the first pixel and a distance from an end portion of a gate of the first transistor of the second pixel to a border between the second element portion and the second pixel are equal to each other.

10. The apparatus according to claim 9,
wherein each of the second conversion units is connected to a second transistor to transfer electric charge, and
wherein a distance from an end portion of a gate of the second transistor of the first pixel to a border between the first element portion and the first pixel and a distance from an end portion of a gate of the second transistor of the second pixel to a border between the second element portion and the second pixel are equal to each other.

11. The apparatus according to claim 10,
wherein each of the pixels has a semiconductor layer and a wiring layer, and
wherein portions included in the wiring layers of the respective pixels and connected to the first transistor or the second transistor have identical structures.

12. The apparatus according to claim 1, wherein the first conversion unit has a plurality of regions of an identical conductivity type and having an identical depth.

13. The apparatus according to claim 12, wherein areas of light portions of the respective regions in the first conversion unit are equal to one another.

14. The apparatus according to claim 1, wherein the second conversion unit has a plurality of regions of an identical conductivity type and having an identical depth.

15. The apparatus according to claim 14, wherein areas of light portions of the respective regions in the second conversion unit are equal to one another.

16. The apparatus according to claim 1, wherein a center of the first conversion unit and a center of the second conversion unit are substantially identical.

17. The apparatus according to claim 1, a distance between a center of the first conversion unit and a center of the second conversion unit is less than a distance corresponding to 10% of a width in a direction perpendicular to a depth direction of a cross-section of the second conversion unit.

18. The apparatus according to claim 1, further comprising a shielding portion, and a shielded pixel shielded by the shielding portion.

19. The apparatus according to claim 18, wherein the shielding portion covers at least one of repeating units of pixels including the first pixel and the second pixel and arranged in two rows and two columns.

20. The apparatus according to claim 1, wherein an area of the conversion unit in a light a receiving surface and an area of the conversion unit in a surface opposite to the light receiving surface are different from each other.

21. The apparatus according to claim 1, wherein the apparatus has a layered structure including a plurality of substrates.

22. A system comprising:
the apparatus according to claim 1; and
a processing unit configured to generate an image, using a signal output by the apparatus.

23. A camera comprising:
the system according to claim 22; and
a lens configured to focus an object image on the apparatus of the system.

24. The camera according to claim 23,
wherein the camera selects a signal of a pixel of which the area ratio is large, with a F-number of the lens more than a threshold, and
wherein the camera selects a signal of a pixel of which the area ratio is small, with the F-number of the lens less than or equal to the threshold.

25. A moving object comprising:
the apparatus according to claim 1; and
a control unit configured to control movement of the moving object, using a signal output by the apparatus.

26. A substrate to be on another substrate, the substrate comprising:
pixels including a first pixel and a second pixel; and
a plurality of microlenses,
wherein each of the pixels has a first conversion unit and a second conversion unit surrounding the first conversion unit,
wherein the first conversion unit and the second conversion unit each have a light portion to receive light from a corresponding microlens,
wherein the first conversion unit and the second conversion unit are under the corresponding microlens, and
wherein a first area ratio between an area of the light portion of the first conversion unit in the first pixel and an area of the light portion of the second conversion unit in the first pixel is different from a second area ratio between an area of the light portion of the first conversion unit in the second pixel and an area of the light portion of the second conversion unit in the second pixel.

* * * * *